(12) United States Patent
Adam et al.

(10) Patent No.: US 12,307,592 B2
(45) Date of Patent: May 20, 2025

(54) TECHNOLOGY CONFIGURED TO PROVIDE USER INTERFACE VISUALIZATION OF AGRICULTURAL LAND, INCLUDING 3D VISUALIZED MODELLING OF AN AGRICULTURAL LAND REGION BASED ON FLOW, HYBRIDIZED MULTIPLE RESOLUTION VISUALIZATION AND/OR AUTOMATED FIELD SEGREGATION

(71) Applicant: Alicanto Media Pty Ltd, Queenscliff (AU)

(72) Inventors: Stuart Adam, Queenscliff (AU); Tim Howell, Queenscliff (AU)

(73) Assignee: Alicanto Media Pty Ltd., Queenscliff (AU)

( * ) Notice: Subject to any disclaimer, the term of this patent is extended or adjusted under 35 U.S.C. 154(b) by 0 days.

(21) Appl. No.: 17/758,194

(22) PCT Filed: Dec. 29, 2020

(86) PCT No.: PCT/AU2020/051443
§ 371 (c)(1),
(2) Date: Jun. 29, 2022

(87) PCT Pub. No.: WO2021/134114
PCT Pub. Date: Jul. 8, 2021

(65) Prior Publication Data
US 2023/0022508 A1    Jan. 26, 2023

(30) Foreign Application Priority Data

Dec. 31, 2019  (AU) ................................ 2019904972
Dec. 31, 2019  (AU) ................................ 2019904973

(51) Int. Cl.
*G06T 17/05*     (2011.01)

(52) U.S. Cl.
CPC .......... *G06T 17/05* (2013.01); *G06T 2200/24* (2013.01); *G06T 2210/24* (2013.01); *G06T 2210/56* (2013.01)

(58) Field of Classification Search
CPC . G06T 17/05; G06T 2200/24; G06T 2210/24; G06T 2210/56; G06T 15/04;
(Continued)

(56) References Cited

U.S. PATENT DOCUMENTS 9,117,305 B2    8/2015   Mcwethy et al.
11,074,447 B1*  7/2021   Fox ......................... G06N 3/08
(Continued)

OTHER PUBLICATIONS

International Search Report for International Application No. PCT/AU2020/051443 dated Apr. 13, 2021, 6 pages.
(Continued)

*Primary Examiner* — Jitesh Patel
(74) *Attorney, Agent, or Firm* — TraskBritt

(57) ABSTRACT

Technology is configured to provide technology configured to provide user interface visualization of agricultural land, including 3D visualized modelling of an agricultural land region based on flow, hybridized multiple resolution visualization and/or automated field segregation. Embodiments of the present disclosure are primarily directed to providing what is in essence a digital twin interface for agricultural land, which provides technical attributes that solve technical problems present in the art.

12 Claims, 16 Drawing Sheets
(3 of 16 Drawing Sheet(s) Filed in Color)

(58) Field of Classification Search
CPC ....... G06T 19/003; G06F 30/13; G06F 30/28; G01W 1/02; G01C 11/28; G01N 33/245
See application file for complete search history.

(56) References Cited

U.S. PATENT DOCUMENTS

| | | | | |
|---|---|---|---|---|
| 11,393,194 | B2* | 7/2022 | Marvaniya | G06V 10/82 |
| 2007/0027591 | A1* | 2/2007 | Goldenberg | G06F 16/9537 |
| | | | | 707/E17.11 |
| 2014/0354688 | A1* | 12/2014 | Min | G06T 19/006 |
| | | | | 345/633 |
| 2016/0140677 | A1* | 5/2016 | Hejny | G06Q 50/163 |
| | | | | 705/40 |
| 2016/0202227 | A1* | 7/2016 | Mathur | A01B 79/005 |
| | | | | 702/2 |
| 2017/0140478 | A1* | 5/2017 | Freeman | G01S 19/14 |
| 2018/0165616 | A1 | 6/2018 | Sun et al. | |
| 2018/0349520 | A1 | 12/2018 | Bhalla et al. | |
| 2021/0319489 | A1* | 10/2021 | Lewis | G06Q 30/0633 |
| 2022/0316188 | A1* | 10/2022 | Takahama | E02F 3/841 |

OTHER PUBLICATIONS

International Written Opinion for International Application No. PCT/AU2020/051443 dated Apr. 13, 2021, 10 pages.

Jenson et al., Extracting Topographic Structure from Digital Elevation Data for Geographic Information System Analysis, photogrammetric Engineering and Remote, Photogrammetric Engineering and Remote Sensing, vol. 54, No. 11, (Nov. 1988), pp. 1593-1600.

Michel et al., Environmental Monitoring 2.0, Conference Paper, https://www.researchgate.net/publication/220965825_Environmental_Monitoring_20, (Mar. 2009), 5 pages.

Yamazaki et al., Merit Hydro: A High-Resolution Global Hydrography Map Based on Latest Topography Dataset, Water Resources Research, vol. 55, (Jun. 26, 2019), pp. 5053-5073.

* cited by examiner

| 10 | 11 | 12 | 13 | 12 | 13 | 9 | 6 |
|----|----|----|----|----|----|----|----|
| 15 | 14 | 13 | 12 | 11 | 10 | 8 | 5 |
| 16 | 15 | 14 | 13 | 12 | 11 | 7 | 6 |
| 14 | 13 | 12 | 11 | 10 | 9 | 8 | 10 |
| 8 | 7 | 6 | 7 | 8 | 14 | 16 | 15 |
| 3 | 3 | 4 | 6 | 17 | 17 | 18 | 17 |
| 5 | 7 | 8 | 11 | 15 | 16 | 18 | 19 |
| 6 | 7 | 9 | 10 | 13 | 15 | 18 | 20 |

FIG. 5A

TECHNOLOGY CONFIGURED TO PROVIDE USER INTERFACE VISUALIZATION OF AGRICULTURAL LAND, INCLUDING 3D VISUALIZED MODELLING OF AN AGRICULTURAL LAND REGION BASED ON FLOW, HYBRIDIZED MULTIPLE RESOLUTION VISUALIZATION AND/OR AUTOMATED FIELD SEGREGATION

CROSS-REFERENCE TO RELATED APPLICATIONS

This application is a national phase entry under 35 U.S.C. § 371 of International Patent Application PCT/AU2020/051443, filed Dec. 29, 2020, designating the United States of America and published as International Patent Publication WO 2021/134114 A1 on Jul. 8, 2021, which claims the benefit under Article 8 of the Patent Cooperation Treaty to Australian Patent Application Serial No. 2019904972, filed Dec. 31, 2019, and to Australian Patent Application Serial No. 2019904973, filed Dec. 31, 2019.

TECHNICAL FIELD

The present disclosure relates, in various embodiments, to technology configured to provide technology configured to provide user interface visualization of agricultural land, including 3D visualized modelling of an agricultural land region based on flow, hybridized multiple resolution visualization and/or automated field segregation. Embodiments of the present disclosure are primarily directed to providing what is in essence a digital twin interface for agricultural land, which provides technical attributes that solve technical problems present in the art. While some embodiments will be described herein with particular reference to those applications, it will be appreciated that the present disclosure is not limited to such a field of use, and is applicable in broader contexts.

BACKGROUND

Any discussion of the background art throughout the specification should in no way be considered as an admission that such art is widely known or forms part of common general knowledge in the field.

Digital twins have become popular in "built" environments (e.g., buildings and/or cities), made possible by a wide range of sensors and other connected devices that have been developed, for example, to function with digital twins, internet of Things (IOT), and/or Building Management Systems (BMS). Aspects of visualization and situational awareness that come about from digital twin interfaces are clear. However, there are clear impediments to extending existing digital twin technologies to non-built and/or "low tech" environments, such as agricultural land.

Farmers rely heavily on rainwater. Conventionally, farm planning, for example, in the context of dam placement, has been a relatively subjective process whereby visual estimation of appropriate water collection properties has been a primary guiding factor. This is by no means ideal, and can result in poor decision making and inefficient utilization of a highly valuable resource.

BRIEF SUMMARY

It is an object of the present disclosure to overcome or ameliorate at least one of the disadvantages of the prior art, or to provide a useful alternative.

Example embodiments are described below in the section entitled "claims."

One embodiment provides a computer implemented method configured to provide water flow modelling for an agricultural land region the method including:

maintaining access to a data source that includes terrain mapping data representative of an agricultural land region, wherein the terrain mapping data includes, for a matrix of points defined for an X-axis and Y-Axis across a terrain area, a respective Z-axis value for each of those points that represents a relative point altitude;

executing a flow analysis algorithm that is configured to determine, for each point in a defined set of points within the terrain mapping data, a measure representative of upstream flow for that point; and based on the output of the flow analysis algorithm, providing via an AgTwin interface graphical information representative of water accumulation and/or flow.

One embodiment provides a computer implemented method configured to provide a graphical user interface configured to enable delivery of information relating to an agricultural land region, the method including:

maintaining access to a data source that includes a terrain mapping data representative of an agricultural land region, wherein the terrain mapping data includes, for a matrix of points defined for an X-axis and Y-Axis across a terrain area, a respective Z-axis value for each of those points that represents a relative point altitude;

causing rendering, at a client terminal, of a user interface that allows for visualization of digital information for the agricultural land region, wherein the user interface includes a digital twin component that includes a three-dimensional object generated based on the terrain mapping data and one or more surface overlays applied to the terrain mapping data;

in a first mode of operation, configuring the digital twin component to render the three-dimensional object with a photo-resolution image overlay;

in a second mode of operation, which is accessed based on a predefined command, configuring the digital twin component to render the three-dimensional object with a secondary overlay generated based on any one or more of: (i) lower-resolution satellite imagery; (ii) data received from one or more physical sensors located on the agricultural land region; (iii) data representative of water flow and/or collection properties.

One embodiment provides a computer implemented method configured to provide a graphical user interface configured to enable delivery of information relating to an agricultural land region, the method including:

maintaining access to a data source that includes a terrain mapping data representative of an agricultural land region, wherein the terrain mapping data includes, for a matrix of points defined for an X-axis and Y-Axis across a terrain area, a respective Z-axis value for each of those points that represents a relative point altitude;

causing rendering, at a client terminal, of a user interface that allows for visualization of digital information for the agricultural land region, wherein the user interface includes a digital twin component that includes a three-dimensional object generated based on the terrain mapping data and one or more surface overlays applied to the terrain mapping data;

performing analysis of aerial photography data associated with the terrain mapping data, thereby to execute a field identification and segregation algorithm;

enabling, via the digital twin component, individualized selection of segregated fields.

One embodiment provides a computer implemented method configured to provide a graphical user interface configured to enable delivery of information relating to an agricultural land region, the method including:

maintaining access to a data source that includes a terrain mapping data representative of an agricultural land region, wherein the terrain mapping data includes, for a matrix of points defined for an X-axis and Y-Axis across a terrain area, a respective Z-axis value for each of those points that represents a relative point altitude;

causing rendering, at a client terminal, of a user interface that allows for visualization of digital information for the agricultural land region, wherein the user interface includes a digital twin component that includes a three-dimensional object generated based on the terrain mapping data and one or more surface overlays applied to the terrain mapping data;

providing an application programming interface that enables sharing of data defined in a third party system to the digital twin component based on common GPS positional coordinates.

One embodiment provides a computer implemented method configured to provide a graphical user interface configured to enable delivery of information relating to an agricultural land region, the method including:

maintaining access to a data source that includes a terrain mapping data representative of an agricultural land region, wherein the terrain mapping data includes, for a matrix of points defined for an X-axis and Y-Axis across a terrain area, a respective Z-axis value for each of those points that represents a relative point altitude;

causing rendering, at a client terminal, of a user interface that allows for visualization of digital information for the agricultural land region, wherein the user interface includes a digital twin component that includes a three-dimensional object generated based on the terrain mapping data and one or more surface overlays applied to the terrain mapping data;

performing analysis of aerial photography data associated with the terrain mapping data, thereby to execute a field identification and segregation algorithm;

enabling, via the digital twin component, individualized selection of segregated fields.

Reference throughout this specification to "one embodiment," "some embodiments" or "an embodiment" means that a particular feature, structure or characteristic described in connection with the embodiment is included in at least one embodiment of the present disclosure. Thus, appearances of the phrases "in one embodiment," "in some embodiments" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

In the claims below and the description herein, any one of the terms "comprising," "comprised of" or "which comprises" is an open term that means including at least the elements/features that follow, but not excluding others. Thus, the term "comprising," when used in the claims, should not be interpreted as being limitative to the means or elements or steps listed thereafter. For example, the scope of the expression a device comprising A and B should not be limited to devices comprising only elements A and B. Any one of the terms "including" or "which includes" or "that includes" as used herein is also an open term that also means including at least the elements/features that follow the term, but not excluding others. Thus, "including" is synonymous with and means "comprising."

As used herein, the term "exemplary" is used in the sense of providing examples, as opposed to indicating quality. That is, an "exemplary embodiment" is an embodiment provided as an example, as opposed to necessarily being an embodiment of exemplary quality.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Embodiments of the present disclosure will now be described, by way of example only, with reference to the accompanying drawings in which:

FIG. 5A to FIG. 5C represent example point altitude values, and are used as context to describing point-point flow relationship algorithms.

DETAILED DESCRIPTION

The present disclosure relates, in various embodiments, to technology configured to enable modelling of an agricultural land region, for example, a property including farmland and other land areas. Embodiments of the present disclosure are primarily directed to technology, including digital twin technology that allows for 3D visualization of an agricultural land region. For example, some embodiments assist in providing visualization of effects of rainwater movement and/or collection, for example, in the context of dam planning and/or crop selection. Other embodiments provide additional forms of data overlay, including technologies by which a high-resolution digital twin representation is overlaid with higher-frequency but lower-resolution imaging data, and/or data supplied by connected sensors.

Example Technology Framework

Figure 1:
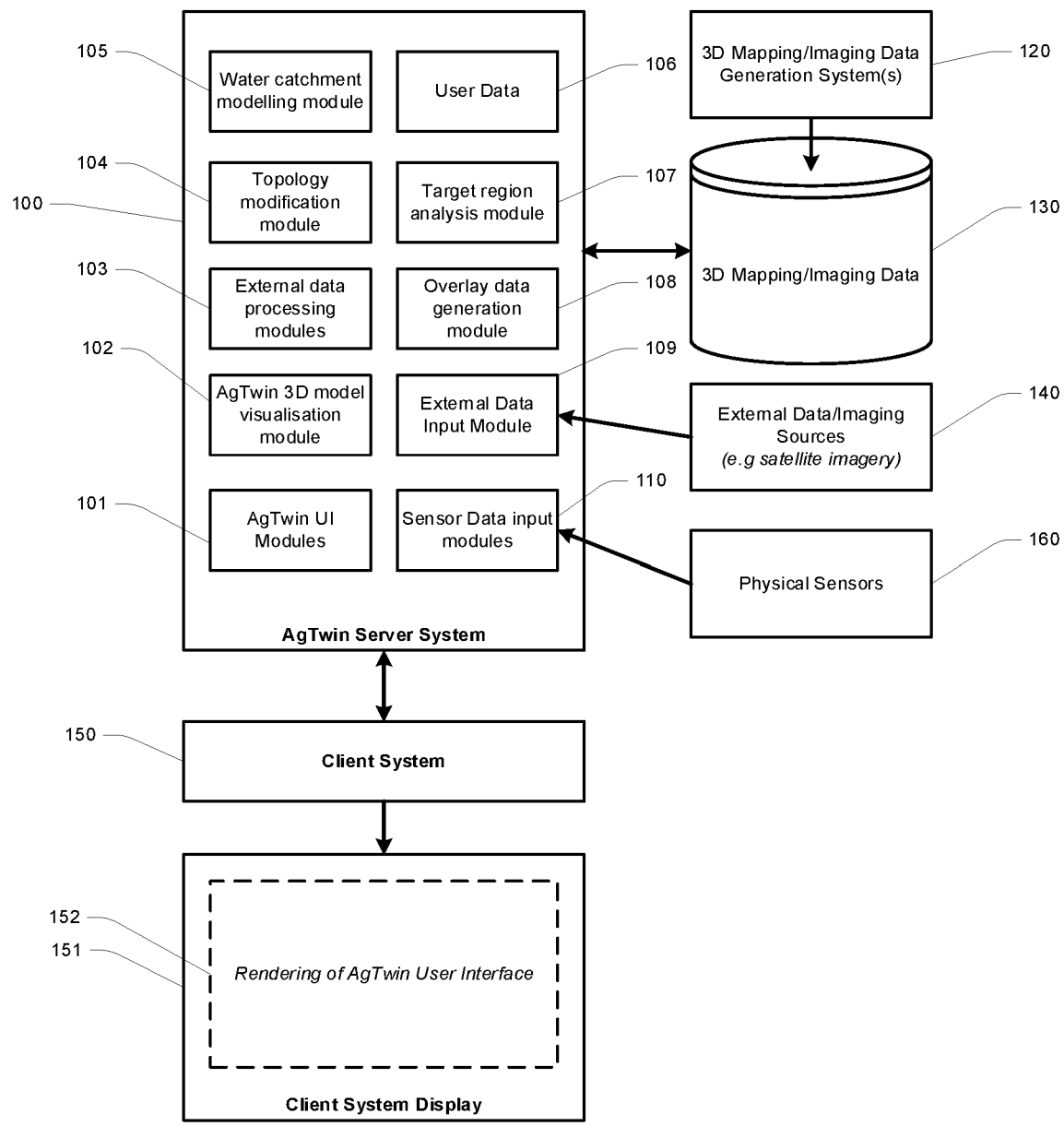
FIG. 1 illustrates a system according to one embodiment.

FIG. 1 illustrates a technology framework according to one embodiment. In overview, the framework centers around a server system, referred to herein as a "AgTwin Server System" 100, which is configured to enable delivery of a user interface 152 for display on a display screen 151 of a client system 150. System 150 is in some embodiments configured to enable delivery of user interface 152 to a plurality of client systems via a browser-based Software As A Service (SAAS) configuration.

The term "AgTwin" is used herein to describe a category of technology whereby a user interface is enabled to deliver a 3D visualization of agricultural land. This is, in a practical sense, comparable to a "digital twin" interface of the sort used in the context of buildings and other constructed environments, in the sense that it provides a visualization tool for an area that is able to overlay various facets of contextual data onto a 3D representation of a physical region. However, whereas a digital twin is conventionally underpinned by 3D modelling data for a build environment constructed from CAD models and the like, the AgTwin interface considered herein is underpinned by 3D mapping and imaging data for a region of agricultural land. In some embodiments discussed herein, an AgTwin is supported by field segregation and GPS-based asset identification, thereby to allow user interface selection of areas of agricultural land and/or physical assets thereby to enable information presentation and other functionates. An AgTwin in preferred embodiments operates by providing a visualization layer (defined by a 3D model, for example, a photomosaic defined by photogrammetry methods, a digital terrain model, or the like) that facilitates visual review of the region, and a control layer (for example, defined by a shape file or the like) that covers substantially the same region as the visualization later and allows identification of locations of user interactions with the model in the context of user interface control operations (for example, selection of an asset or field). Additional visualization layers are able to be defined by using a point cloud, digital surface model and/or digital terrain model, and assigning color values to points/pixels based on a defined algorithm that assigns an information value to each pixel (for example, an elevation, upstream flow metric, slope gradient, or the like) thereby to enable delivery of information overlays (optionally with controllable variable transparency).

The term "agricultural land" is used broadly to describe a geographical region that includes regions that are used for agricultural purposes (for example, grazing of livestock, growing of crops, and so on). It is by no means necessary that an entire "agricultural land region" as described herein is used and/or suitable for agricultural purposes; the term "agricultural land region" is used to describe a region that is mapped for the purposes of an AgTwin interface, and is preferably defined based on boundaries representative of property ownership (or other relevant boundaries).

The AgTwin interface provided by system 100 utilizes 3D mapping and imaging data maintained in a database 130. This includes data provided by one or more 3D mapping/imaging data generation systems 120. Example technologies by which mapping and imaging data is defined for a given agricultural land region include:

Aerial imagery using cameras.
LiDAR scanning, for example, using manned or unmanned aerial vehicles.

Other technologies may be used in further embodiments. In some embodiments, as discussed further below, a combination of aerial imagery and LiDAR scanning is used, with aerial imagery being processed via photogrammetry methods to provide a 3D photomosaic model of an overall land area, which is supplemented with models generated from LiDAR scanning to provide detailed views of localized regions.

In a preferred embodiment, the database includes, for a given agricultural land region, data including:

Imaging data, including color photos at a defined resolution (for example, with each pixel representing a land area of between 1 cm$^2$ and 10 cm$^2$, preferably between about 3 cm$^2$ an 8 cm$^2$). This may be a single image (for example, a high-resolution satellite image), composite image generated from stitching of a plurality of images (for example, satellite and/or aerial photography images), or multiple images. Each image is associated with positional data, for example, defined based on the GPS coordinate system, thereby to provide locational context to the image.

A matrix of points defined in relative three-dimensional space across a terrain area defining the agricultural land region, with each point having an X-axis value, Y-Axis value, and Z-axis value (with the Z-axis representing a relative point altitude), for example, stored as point cloud values.

In a preferred embodiment, a plurality of partially overlapping high resolution images are captured via top-down aerial imaging (for example, using manned and/or unmanned aircraft), each image being associated with location data (for example, using Real-Time Kinematic (RTK)) GPS technologies thereby to obtain accurate positional data. These images are processed using photogrammetry methods (for example, via a commercially available software product such as PIX4D) thereby to generate 3D model data for a captured region. The 3D model data may include data that allows for rendering of a 3D photomosaic, point cloud, 3D mesh, digital terrain model, and the like.

It will be appreciated that the point-cloud data defined by the matric of points enables generation, by a computer process, of various forms of graphical representations. This may include representations whereby the points are used to define a surface, for example, a textured surface, that visually represents the topography of the region. Where the imaging data and matric of points are defined relative to a common set of coordinates (for example, GPS coordinates), this allows application of the imaging data (two-dimensional) onto a surface defined by a point cloud or terrain/surface model (three dimensional) thereby to define a three-dimensional photo realistic model of the region. In further embodiments, alternate technologies are used thereby to generate a three-dimensional photo realistic model of the region (for example, photogrammetry methods).

Database 130 is configured to maintain, for one or more agricultural regions, a respective set of imaging data and elevation/point cloud data that has been defined (for example, via one or more pre-processing techniques that adjust input data) thereby to define sets of 3D model data for the respective regions, with each set of 3D model data being used by system 100 to provide a AgTwin interface for a respective client (defined by a client account, which may be accessed via one or more client systems in the form of networked computing devices).

System 100 includes an AgTwin model visualization module 102 that is configured to, based on a given set of 3D model data associated with a given client, enable rendering at a client system of an AgTwin user interface including a digital twin display object that allows 3D rendering and navigation of a rendered representation of the 3D model. For example, this may be a 3D rendering of a three-dimensional photo realistic model of the relevant region. AgTwin UI modules 101 are configured to enable rendering and utilization of additional user interface components, including interactive components that provide functionality to the AgTwin interface. This includes, for example:

Navigational control objects that enable a user to manipulate a view of the 3D model, thereby to in effect navigate the region in three dimensions (e.g., pan, rotate and zoom operations).
Activate/deactivate various available information overlays based on operation of an overlay data generation module 108, for example, overlays generated based on: measured attuites of the topography (e.g., color coding land areas based on slope gradient or altitude); attributes generated based on data from external data/imaging systems 140, which are received via an input module 140 (which may include satellite data/images, Normalized Difference Vegetation Index (NVDI) imagery data); data from physical sensors (for example, moisture sensors, light sensors, wind sensors, soil sensors); overlays based on a water flow modelling algorithm (as discussed in detail further below), localized high-resolution 3D models (for example, via LiDAR scanning), and other information.

Perform modelling and/or obtain data representative of location-specific attributes, for example, foliage density, foliage type, water (including rainwater) collection, and others.

Identify and select graphical objects superimposed on the 3D model, thereby to access data associated with those objects. For example, objects may be representative of: physical sensors at known locations, such as physical sensors that provide live data; images and/or other data collected at known locations (for example, by a user); field labels; locations of physical equipment (including moving equipment); and other information artefacts.

In the present example of FIG. 1, the AgTwin user interface is rendered at a client terminal based on downloading of web-hosted code for execution via a local web browser application. In other embodiments, a locally-stored software application is used, which optionally allows for local storage of data maintained in database 130 and local execution of software modules provided by system 100 in the example of FIG. 1.

Generation and Configuration of AgTwin Interface

Figure 2A:
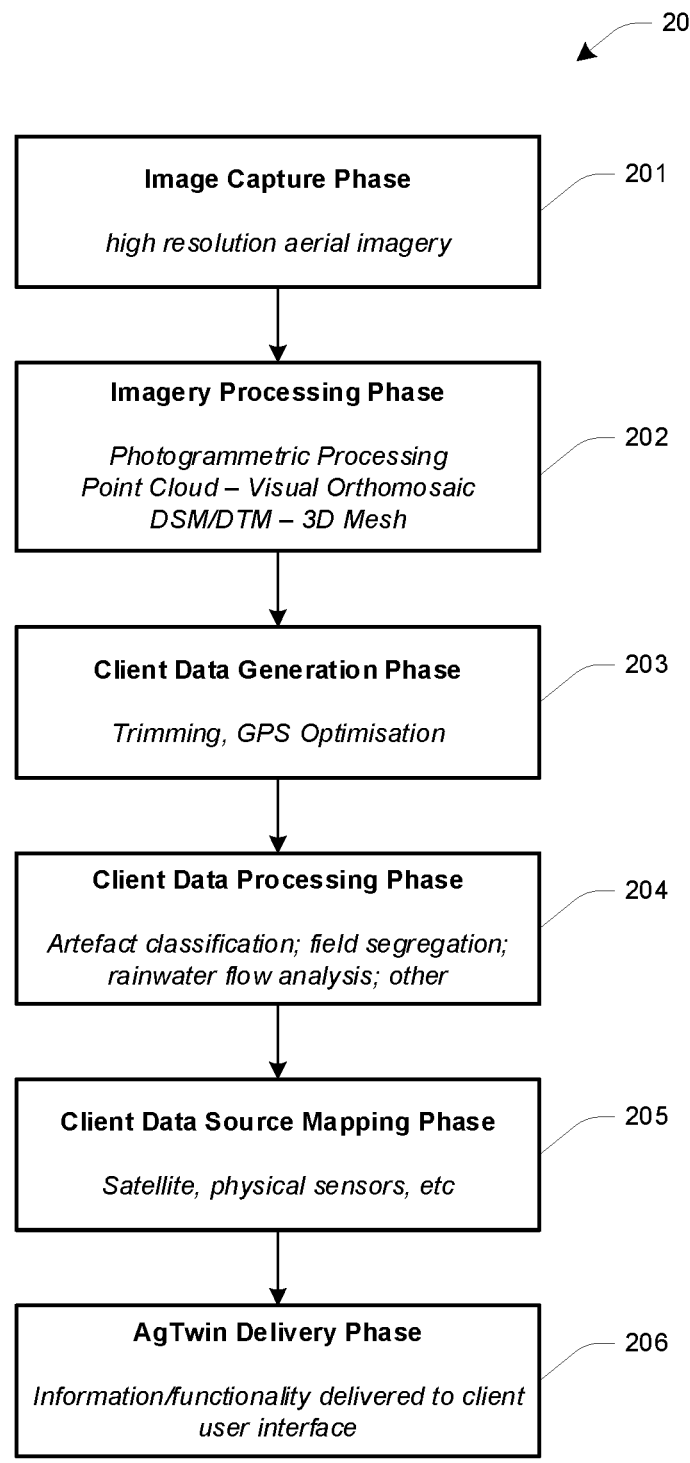
FIG. 2A to FIG. 2E illustrate example methods according to embodiments.

FIG. 2A illustrates a method 200 according to one embodiment for configuring an AgTwin interface for a particular client account. This is an example only.

Block 201 represents an image capture phase. This include capture of a series of aerial photographs having controlled defined characteristics. The characteristics include: an image capture resolution (for example, determined by a camera that is used); a capture altitude (which, in combination with the image resolution, determines a practical resolution defined in terms of an approximate relationship between a single pixel and a distance on land, for example, with each pixel representing between 1 cm$^2$ and 10 cm$^2$); a capture area (for example, defined by a boundary that approximately or directly corresponds to a boundary of a region of agricultural land for which an AgTwin is being generated); and an image overlap (for example, between 5% and 20% overlap). Each image is associated with GPS data, preferably enhanced by use of RTK infrastructure thereby to optimize accuracy. The output of the phase at block 201 includes the series of images, each with data representative of recorded GPS positioning at capture.

Block 202 represents an image processing phase, which in the present embodiment includes photogrammetric processing thereby to generate 3D model data from the two-dimensional images. This 3D model data may include (or enable generation of) point cloud data, a visual orthomosaic (which may be defined by pixels each having a color property and 3D position property), a Digital Terrain Model (DTM), a Digital Surface Model (DSM); a 3D mesh, and the like. The phase at block 202 may be performed using known software products, including (but not limited to) those marketed under the names PIX4D, Global Matter, AgiSoft, and others. No approval or affiliation is suggested by the use of commercial product names herein.

Block 203 represents a client data generation phase, whereby 3D model data generated at the phase at block 203 is processed thereby to transform fairly standard 3D model data into a form that is suitable for the AgTwin interface. The phase at block 203 may include any one or more of the following processes:

(i) Conversion of 3D model files into a required file format, for example, a GeoTIFF, point cloud, 3D mech, or the like.

(ii) GPS optimization. In some embodiments, the 3D model will be associated with a first set of GPS data, which allows for determination of GPS coordinates for any given position in the model, optionally derived from a process that utilizes capture positions and altitudes thereby to infer ground positions. Ground based physical markers having precisely known GPS coordinates may be used to validate accuracy of GPS data associated with the GPS model, and perform a translation of that data for improved accuracy. It will be appreciated that high accuracy for ground positions on the model is important, for instance, due to functionalities described below whereby the AgTwin interface additionally displays data representative of infrastructure and/or sensors at locations defined by GPS coordinates. In some embodiments, this process is performed within the phase at block 202 on an image-by-image basis, thereby to optimize/verify GPS data for each image prior to photogrammetry-based model generation.

(iii) Trimming of the 3D model boundaries based on boundaries of property ownership for regions of agricultural land for which a particular AgTwin interface is being provided.

(iv) Addition or swapping of regions for alternate 3D models. For example, in some embodiments, one or more regions of a 3D model generated via photogrammetry methods are removed and replaced with other 3D model data, for example, CAD data (for instance, in the case of buildings or the like) and/or LiDAR models (for example, where specific areas of crops are scanned at close range using LiDAR equipment). In some embodiments, this includes marking areas of the photogrammetry-based 3D model that are able to be swapped out for 3D models generated via alternate processes, with such swapping being optionally performed based on user instructions. For example, this phase includes obtaining one or more 3D models from alternate sources (for example, LIDAR models), defining boundaries for those models based on the same GPS schema as for the AgTwin model, thereby to define cut lines at which portions of the photogrammetric AgTwin model is able to be exchanged for the other models. In some embodiments, the exchange is automated based on a threshold zoom level.

At the end of the phase at block 203, there is a repository of 3D model data, including data representative of point cloud data, visual orthomosaic data, and the like, that has accurate GPS data and is in a format that enables rendering via the AgTwin user interface (for example, via an object used by a particular geo-visualization plugin that is executed via a web browser).

The phase at block 204 represents a client data processing phase, which includes processing of data provided via the 3D model and/or data provided by the 2D aerial imagery thereby to extract additional contextual information for display on the AgTwin interface. Examples are described below.
- (i) Field Segregation. This includes performing one or more processes thereby to automatically identify field boundaries within the agricultural land, thereby to define a database a record corresponding to each field. A field is able to be represented by a polygon defined by reference to the same GPS schema that applies to the 3D model, thereby to enable graphical identification of the field by, for example: (i) providing an overlay that displays lines along field boundaries defined by the polygon; and/or (ii) providing a shaded overlay of the area enclosed by the polygon. Example processes for field boundary identification and polygon generation are described further below.
- (ii) Artefact identification. This includes performing image-based analyses using one or more pre-trained AI based image classifiers thereby to identify known physical artefacts in image data (e.g., 2D image data from arrival imagery, or 2D image data extracted from the 3D model). This may be used to identify a range of physical artefacts, based upon what the classifiers are trained to identify. Examples include: buildings; dams; solar infrastructure; vegetation of specific types; soil types; fences, soil of specific types, and other visually identifiable artefacts.
- (iii) Water (including rainwater) flow analysis. This is discussed in more detail further below. In overview, elevation data is processed thereby to determine water (including rainwater) collection/flow characteristics for agricultural land represented by the elevation data. In some embodiments, this includes assigning a plurality of points (for example, each pixel, or each cluster of pixels of a predefined size) with a collection measure representative of how much water flows to that point. For example, in some embodiments, this is based on an algorithm that determines point-to-point flow relationships, as discussed further below.

Data generated at block 204 is optionally made available to algorithms that generate graphical overlay data for display on the AgTwin model.

Block 205 represents a client data source mapping phase. This includes (i) identifying a data source available at a networked location, for example, a data feed from a sensor device, or an output of data from a third party platform via an API; identifying a data type for the data source, wherein the data type is associated with user interface elements that are configured to present data received from the data source; (iii) configuring a new instance of the identified data type, including data binding between the networked source and elements of the new instance of the data type thereby to configure automated population of values from the source to the elements (e.g., via push or pull approaches); (iv) determining a GPS coordinate location thereby to allow display of a graphical object on the AgTwin interface; and (v) causing presentation of the graphical object at the determined GPS coordinates, such that by a user selecting that object via the AgTwin interface the user is able to view data from the data source. In some embodiments, graphical features of the graphical object inherently display data from the data source (for example, by color, alphanumeric overlays, icons, and the like).

Block 206 represents an AgTwin delivery phase, whereby a user of a client device navigates to a predefined web address, inputs credential data (for example, a username and password), and is enabled to access the AgTwin interface defined via the processes of blocks 201 to 205. It will be appreciated that different users will have access to different versions of the AgTwin interface, with a common one or more server systems maintaining model and other supporting data for those respective AgTwin interfaces.

Example Screenshots

Figure 4A:
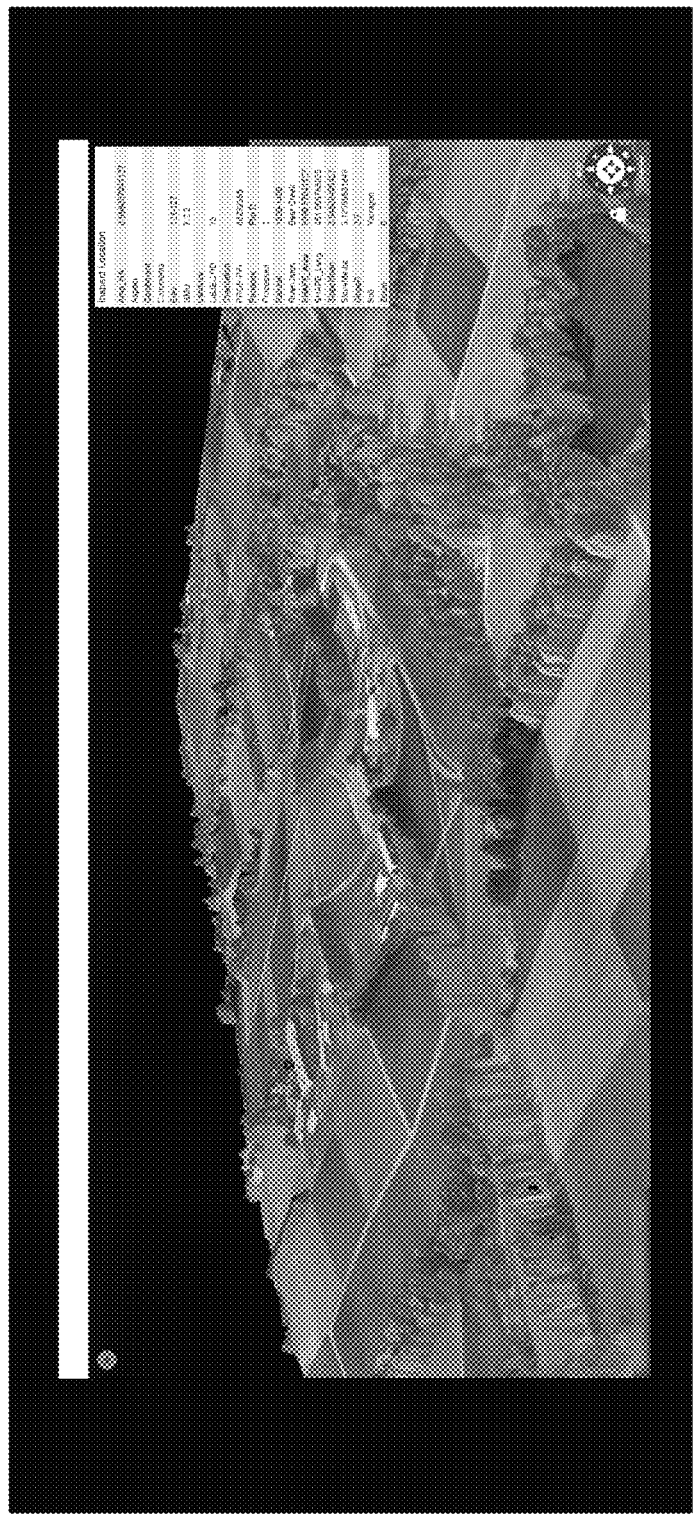
FIG. 4A to FIG. 4F illustrate example screenshots.
Figure 4B:
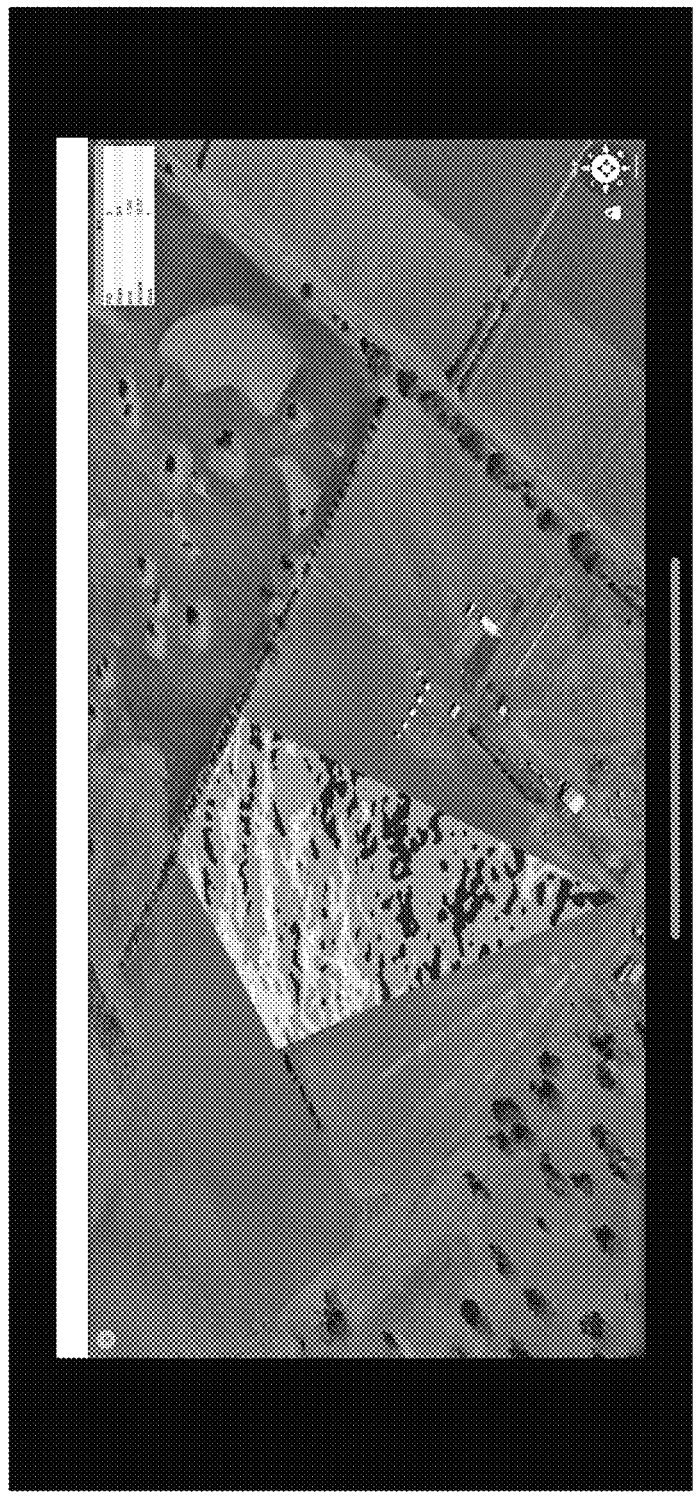
Figure 4C:
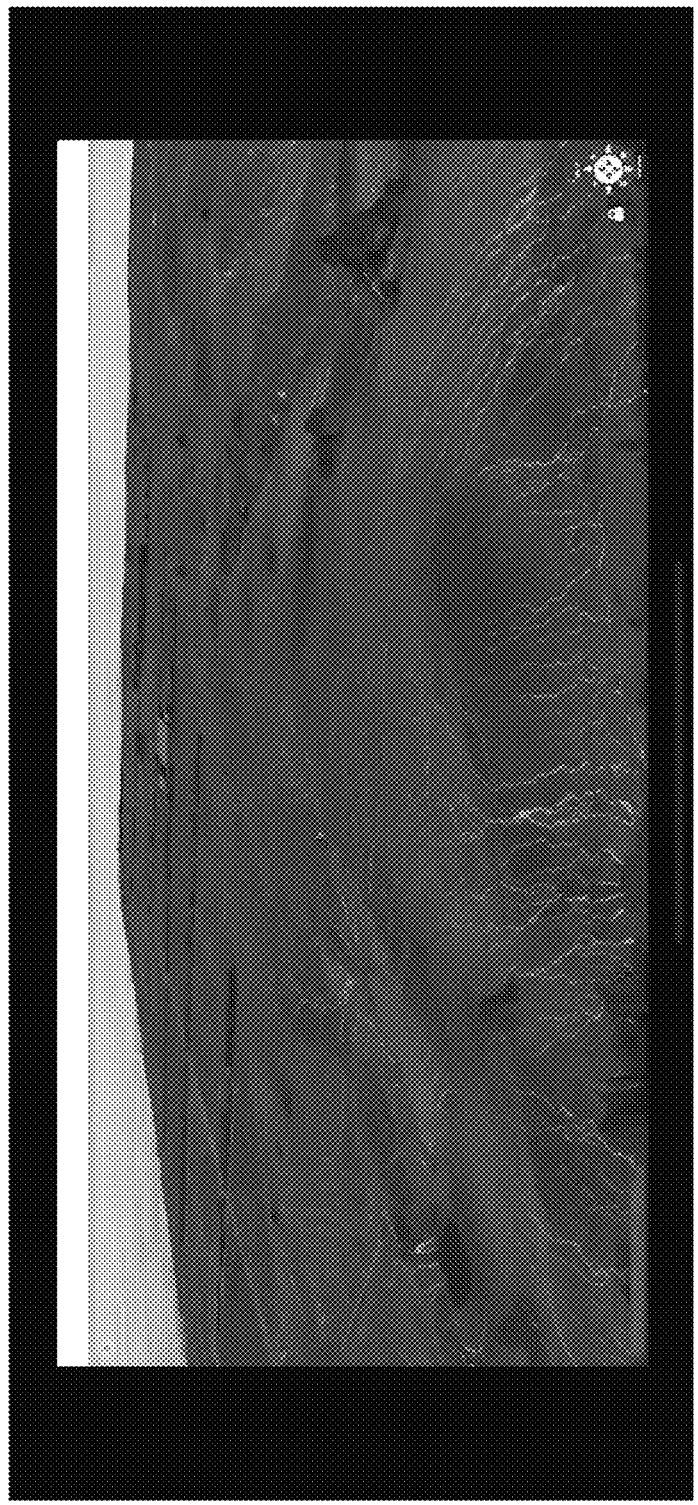
Figure 4D:
Figure 4E:
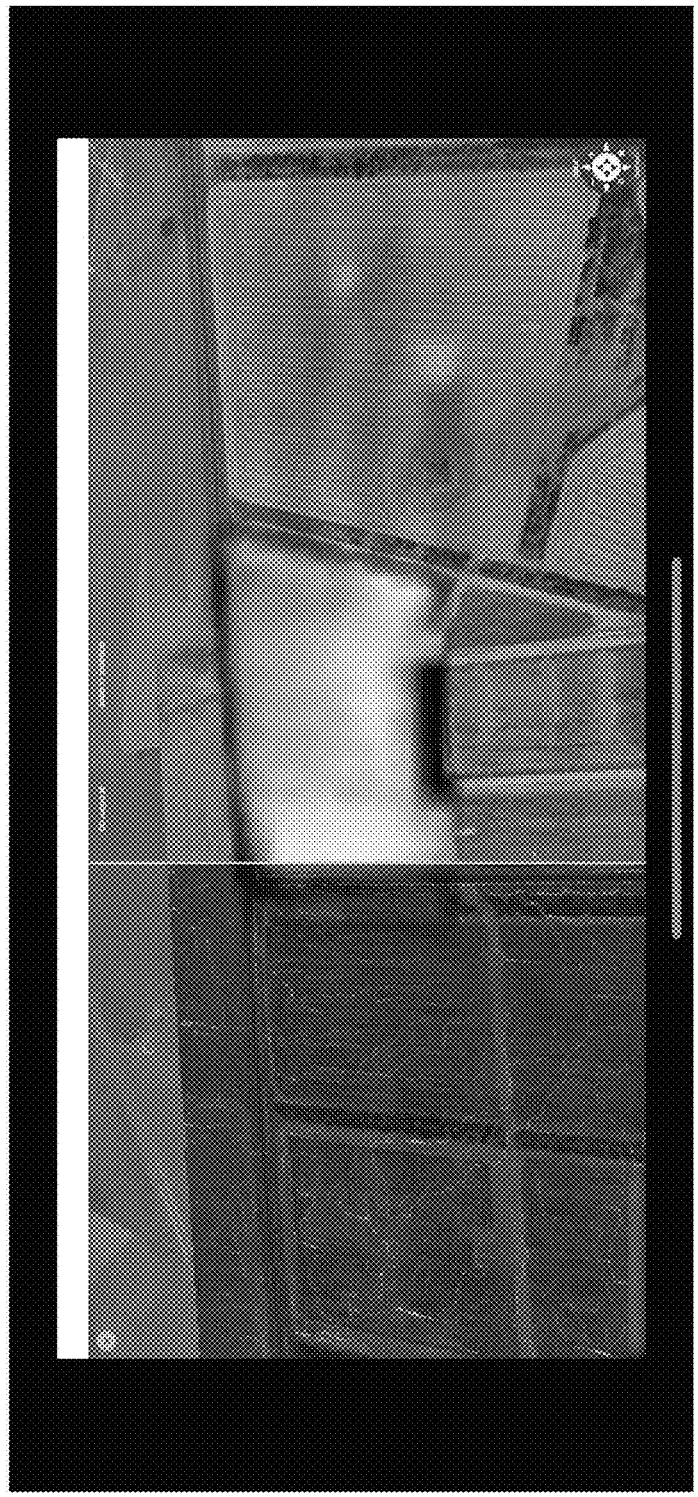
Figure 4F:

FIG. 4A to FIG. 4F provide example screenshots according to one implementation. These are used to provide additional illustrative context to embodiments and examples discussed further below. These each provide a view of an AgTwin interface including a portion of a rendered AgTwin model. In overview:
- FIG. 4A shows a rendering of an AgTwin model, rendered as a 3D photomosaic, with a point selected, along with detailed information regarding that point in an information display object on the right hand side.
- FIG. 4B shows a rendering of an AgTwin model, rendered as a 3D photomosaic, with a field selected and highlighted by way of a polygon, with an elevation information overlay applied to that polygon thereby to show elevation information for that field. Additional information regarding that field is provided in an information display object on the right hand side.
- FIG. 4C shows a rendering of an AgTwin model, rendered as a 3D photomosaic, with additional graphical overlays to provide water flow and collection information.
- FIG. 4D shows a rendering of an AgTwin model, rendered as a 3D photomosaic, with graphical objects positioned to represent physical sensors (in this case being soil sensors). Live data and other information regarding a user-selected one of the sensors is provided in an information display object on the right hand side.
- FIG. 4E shows a rendering of an AgTwin model, rendered as a 3D photomosaic, with a field selected and highlighted by way of a superimposed graphic showing NVDI information.
- FIG. 4F shows a rendering of an AgTwin model, rendered as a 3D photomosaic, with a field selected and highlighted by way of a superimposed graphic showing NVDI information, additionally with an overlay of water flow and collection information, thereby to allow a user to visualize relationships between NVDI and water flow/collection.

It will be appreciated that these are intended to be non-limiting examples.

Example Field Segregation Technology

As noted above, in some embodiments, an AgTwin system, such as system 100 is configured to perform a field segregation process thereby to enable defining of field boundary data based on the same coordinate system (e.g., GPS) that is defined for the 3D model data, thereby to allow for a plurality of individual fields to be identified by the AgTwin interface.

An example method for field segregation includes:
- (i) Determining data representative of field boundaries for a given field;
- (ii) Generating a new field record in AgTwin data, wherein the field record is associated with data representative of the field boundary (for example, a polygon); and
- (iii) Populating the new field record to include a Field ID, one or more data containers that contain (or are configured to contain) information about the field (for example, area, crop type, etc.).

The step of determining data representative of field boundaries for a given field varies between embodiments, and may include any one or more of the following:

- Manual identification, whereby a user manually interacts with the model thereby to position field boundaries (for example, by clicking on points to define polygon vertices).
- AI-based image classification, whereby a pre-trained AI-based image classifier is used to identify graphical artefacts, for example, fences. Locations of fences are used to identify autonomously vertices and generate polygons for the purposes of field segregation. For example, an AI classifier is trained with a sufficient number of aerial images containing fences, thereby to allow the classifier to autonomously identify fences in new images.
- Networked fence sensors, with known GPS locations may be used to enable determination of vertices.

FIG. 4B shows a rendering of an AgTwin model, rendered as a 3D photomosaic, with a field selected and highlighted by way of a polygon. In this example the polygon is configured to display a graphical overlay representative of elevation information (which is optionally derived from point cloud data, 3D mesh data, DTM data, or the like). It will be appreciated that a range of graphical overlays may be used, including an overlay that highlights only the field boundary. Additional information regarding that field is provided in an information display object on the right hand side (for example, information extracted from the field record, and information inputted by a user).

In use, a user views the AgTwin interface, and is able to select one or more fields by interacting with the model (for example, via a click-to-select technique), and having selected one or more fields, the user is able to select one or more data overlays for application to that field.

Hybrid Resolution AgTwin Mapping Technology

Some embodiments include computer implemented methods configured to provide a graphical user interface for delivery of information relating to an agricultural land region via a hybrid resolution interface.

In overview, a "hybrid resolution interface" as described herein is a graphical user interface that is configured to render, in combination:

(i) A photo-realistic 3D model of an agricultural land region, for example, as a photomosaic as described above. This is a static display, in the sense that images used to generate the photomosaic are captured by aerial photography as "one-off" events (for example, once, monthly, yearly, or the like).

(ii) A secondary overlay, which is generated based on dynamic data received from a networked source, is provided at a different resolution to the 3D model.

For example, in various embodiments, the secondary overlay may include:

Satellite imagery. In one embodiment, a two-dimensional satellite image is: obtained from a source: trimmed to correspond to the region covered by the AgTwin model (or a defined portion thereof, for example, a segregated field); transformed to be rendered as a texture on a 3D model defined for the AgTwin, for example, a 3D mesh; and applied to the AgTwin interface as an overlay (with a predefined or user defined level of transparency). In this manner, the AgTwin interface is able to show current imagery data, typically at a lower resolution than the photomosaic, in conjunction with the photomosaic.

Sensor data imagery. For example, one or more sensor devices are located at known GPS locations, each transmitting one or more live data values. These live data values are used to define a spatial image, for example, an image whereby color coding is defined base on a combination of a sensor value and a distance from the sensor. This is then applied as a texture to the 3D mesh thereby to define a 3D overlay that is able to be applied to the photomosaic (with a predefined or user defined level of transparency). In this manner, the AgTwin interface is able to show current live sensor data interpreted as a 3D model, in conjunction with the photomosaic.

Overlay data generated based on analysis of elevation data values, for example, slope gradients, elevation banding, and water flow/accumulation characteristics as described in more detail further below.

Overlay data generated based on image processing, based on the photomosaic or underlying aerial photography data. For example, in one embodiment, image processing techniques (for example, based on color composition and/or AI-based image classification) are used thereby to perform an automated prediction of vegetation and/or soil characteristics.

An example method includes maintaining access to a data source that includes a terrain mapping data representative of an agricultural land region, wherein the terrain mapping data includes, for a matrix of points defined for an X-axis and Y-Axis across a terrain area, a respective Z-axis value for each of those points that represents a relative point altitude; and causing rendering, at a client terminal, of a user interface that allows for visualization of digital information for the agricultural land region, wherein the user interface includes a digital twin component that includes a three-dimensional object generated based on the terrain mapping data and one or more surface overlays applied to the terrain mapping data. The rendering is achieved such that: in a first mode of operation, configuring the digital twin component to render the three-dimensional object with a photo-resolution image overlay; and in a second mode of operation, which is accessed based on a predefined command, configuring the digital twin component to render the three-dimensional object with a secondary overlay, for example, as described above.

Figure 2B:
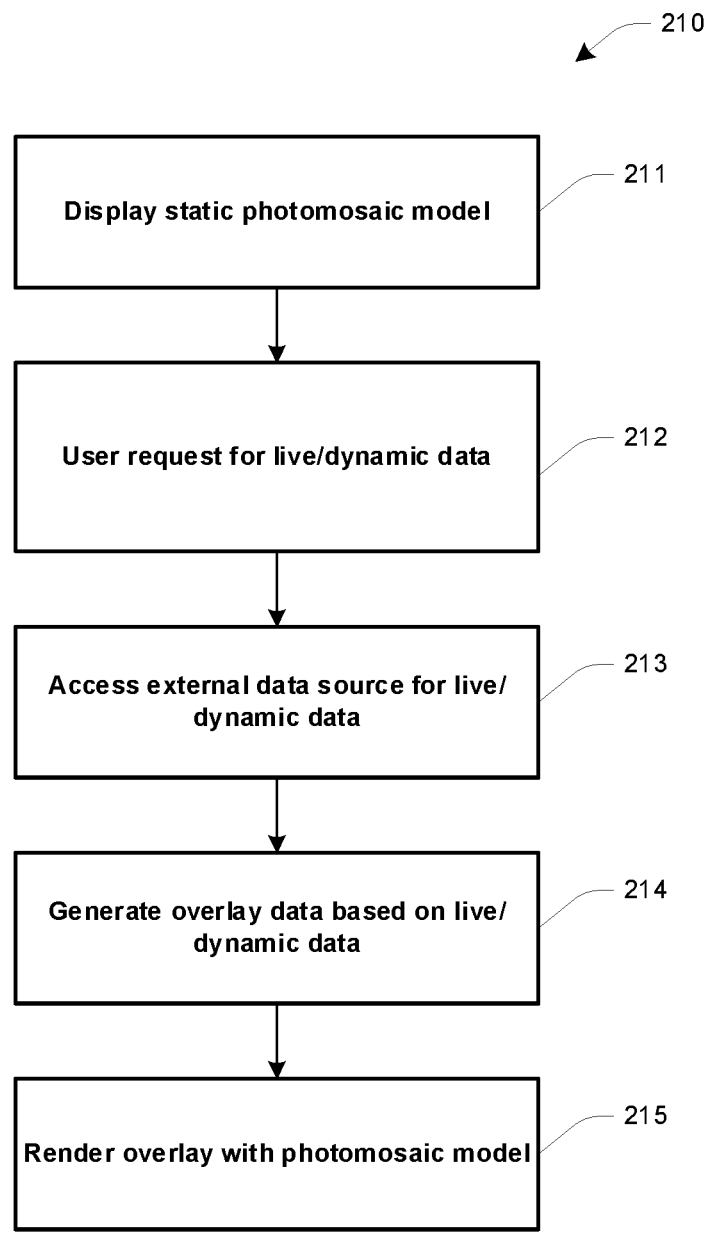

FIG. 2B illustrates a method 210 according to one embodiment. Block 211 represents a process whereby a static photomosaic 3D model is presented via the AgTwin user interface. This is "static" in the sense that the photomosaic is based on aerial imagery; the model is able to be navigated by the user in three dimensions. Block 212 includes receiving a request for live/dynamic data, for example, live satellite imagery, and/or satellite imagery covering a defined range of dates. Block 213 represents a process including accessing a data source for that live/dynamic data (such as a web-based data source), which, in this example, is a data source that makes available point-in-time satellite imagery. Block 214 represents a process whereby an overlay is generated for each item of point-in-time satellite imagery for the defined range of dates, which includes cropping and transformation onto the AgTwin model 3D mesh (for example, for a defined sub-region of the area covered by the AgTwin model, for example, a particular segregated field). These are then rendered via the AgTwin interface as overlays on the photomosaic model at block 215, preferably individually in a sequential manner (optionally with transition between point-in-time overlays controlled by a user via a slider object or the like).

Example Sensor Data Display

As noted above, FIG. 4D shows a rendering of an AgTwin model, rendered as a 3D photomosaic, with graphical objects positioned to represent physical sensors (in this case being soil sensors). Live data and other information regarding a user-selected one of the sensors is provided in an information display object on the right hand side.

In this regard, one embodiment includes a method for delivering an AgTwin interface including: rendering a 3D photomosaic having known GPS location properties; and maintaining connected sensor data representative of: (i) for each sensor, a GPS location for that sensor; and (ii) for each sensor, one or more network locations from which a respective one or more sensor data value streams are available. The method then includes displaying as an overlay on the 3D photomosaic model, for each sensor, a graphical icon corresponding to a defined sensor type for that sensor. In response to user selection of a given one or more of the sensors (e.g., via the icons), the AgTwin interface is configured to display data representative of one or more of the data streams for each of the one or more selected sensors. This may include display of data in overlaid alphanumeric form, in a tabular form, and/or as a colorized overlay (for example, an overlay whereby colorization is determined based on a sensor value and proximity to the sensor).

Examples of sensors include:
Soil sensors, for example, soil sensors that stream to a cloud location live data representative of soil conductivity and/or moisture.
Livestock sensors, which provide live data representative of livestock location.
Equipment sensors, which provide live data representative of equipment location and optionally operational status.
Irrigation sensors.
Feedlot sensors.
Fence sensors (for example, in the case of electrified fences).

It will be appreciated that this allows for an interface that provides similar functionality to a conventional digital twin technology. However, whereas conventional digital twins make use of CAD models (or the like) thereby to represent a 3D model of a built environment, the present technology makes use of a 3D photomosaic model generated from aerial imagery to display live data from sensors positioned on agricultural land.

Machine Operation Planning

In some embodiments, the AgTwin interface includes a user interface tool that enables generation of pathway data via selection of locations rendered on the photomosaic. This data is then able to be converted into GPS-based instructions for upload to farm machinery, thereby to enable controlling of that equipment for automated (or semi-automated) tasks, for example, waypoint-based operational tasks.

Rainwater Modelling Technology

Some embodiments relate to technology configured to provide water (including rainwater) collection modelling for an agricultural land region. This may be provided via the framework of FIG. 1, and is described by reference to such an implementation. However, it will be appreciated that computer implemented method described below may be implemented via alternate technological frameworks in other embodiments.

Although rainwater is used as an example herein, it should be appreciated that the technology may be used to model flow of a range of substances, for example, irrigation water, chemicals, topsoil, and the like (which flow in response to accumulation of water at defined locations).

In overview, as discussed above, 3D model data including elevation data is maintained for a region of agricultural land. This elevation data may be defined as a discrete point cloud file, a digital terrain model, a digital surface model, or by elevation data for pixels in a photomosaic or other image file. In some embodiments, a digital surface model is defined using a smoothing algorithm configured to remove vegetation (e.g., trees) from a defining a ground-representative surface.

Elevation data is processed based on a flow analysis algorithm, which is determined based on relative elevation values for adjacent/proximal points, directions of water flow and accumulative flow metrics. Example algorithmic approaches are discussed below. This allows for a 3D model (for example, a photomosaic, digital terrain map, or the like) rendered by the AgTwin interface to display graphical attributes associated with rainwater flow and collection.

One embodiment provides a computer implemented method configured to provide water (including rainwater) collection modelling for an agricultural land region, the method including: maintaining access to a data source that includes terrain mapping data representative of an agricultural land region, wherein the terrain mapping data includes, for a matrix of points defined for an X-axis and Y-axis across a terrain area, a respective Z-axis value for each of those points that represents a relative point altitude; executing a flow analysis algorithm that is configured to determine, for each point in a defined set of points within the terrain mapping data, a measure representative of water (including rainwater) collection at that point; and based on the output of the flow analysis algorithm, providing via a digital twin interface graphical information representative of water accumulation and/or flow.

In some embodiments, the flow analysis algorithm includes a point-point flow analysis process configured to determine, for each given point in the defined set of points, a measure representative of a number of points having an upstream flow relationship to that given point. The defined set of points may be, for example, each pixel in a model, each point in a 3D point cloud, or a sampling of points/pixels. The measure representative of a number of points having an upstream flow relationship to that given point in some cases provides a measure of surface area (for example, each point or grouping of points is associated with an upstream area that serves as a rainwater collection zone).

In some embodiments, the point-point flow analysis algorithm determines, for each given point, an adjacent point having a lowest point altitude value, and defines a point-point flow relationship between those points. Defining a point-point flow relationship between those points optionally includes defining an upstream flow relationship from the adjacent point having a lowest point altitude value to the given point. It will be appreciated that this enables subsequent algorithms/processes to analyze water (and/or soil) flow and accumulation characteristics across a 3D model.

This optionally includes an accumulation analysis process that includes: (i) for each point defining a permeation factor;

and (ii) based on an initial accumulation condition and the point-point analysis process, determining for each point a total accumulation value defined by a local accumulation value and a flow accumulation value. For example, the flow accumulation value corresponds to a sum of total accumulation values for all adjacent points for which an upstream flow relationship is defined. The permeation factor is optionally based on any one or more of: a ground type; a soil type; a vegetation type; and a slope gradient. For example, the permeation factor is defined to represent a proportion of water that permeates and compared to proportion that flows to the lowest adjacent point, thereby to enable assessment to rainwater accumulation based on a standardized rainfall amount.

In an alternate embodiment, the permeation factor is defined to represent a proportion of soil that remains in place and a proportion soil that migrates to the lowest adjacent point based on a standardized rainfall amount, thereby to enable modelling of soil migration due to erosion.

The method includes generation of overlays/3D models for rendering via a user interface, for example, the AgTwin interface of FIG. 1. This may include any one or more of the following:

- Based on output from the flow analysis algorithm, executing an algorithm thereby to generate a 3D model or overlay that graphically identifies areas based on a measure of upstream terrain area.
- Based on output from the flow analysis algorithm, executing an algorithm thereby to generate a 3D model or overlay that graphically identifies areas based on a measure of upstream terrain area and a measure of slope gradient.
- Based on output from the flow analysis algorithm, executing an algorithm thereby to generate a 3D model or overlay that graphically identifies areas based on a measure of modelled rainfall accumulation based on a combination of localized accumulation and downstream flow accumulation. In this regard, the downstream flow accumulation is calculated via a process that models proportional permeation of rainwater into ground.
- Based on output from the flow analysis algorithm, executing an algorithm thereby to generate a 3D model or overlay that graphically identifies a catchment area for a selected target region. The selected target region is optionally: a segregated field; a crop growing area; an existing dam; or a proposed dam.
- Based on output from the flow analysis algorithm, executing an algorithm thereby to generate a 3D model or overlay that graphically identifies areas impacted by existing and/or proposed irrigation infrastructure at one or more defined locations.

Figure 2C:
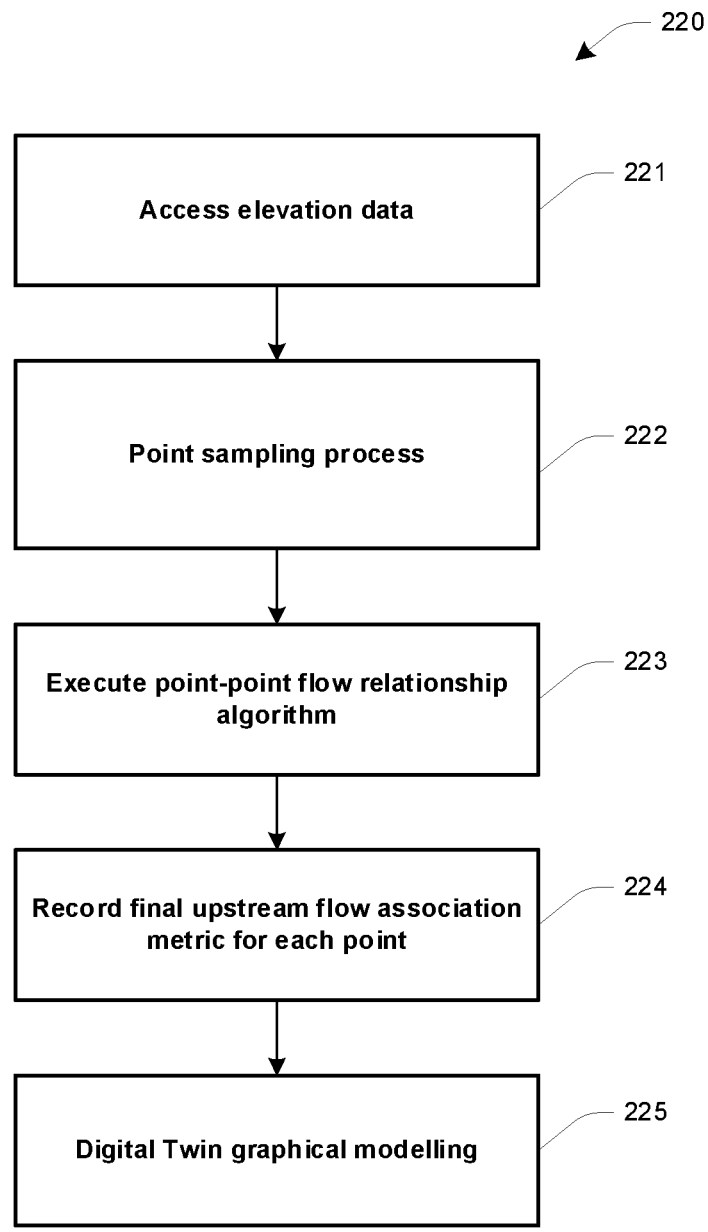

An example method is described by reference to FIG. 2C, which illustrates a method 220, and which is performed by water catchment modelling module 105 of AgTwin server system 100. This method is a pre-processing step performed to determine rainwater accumulation data for a predefined set of terrain data, which results in data that is able to be used for generation of use information via subsequent processes. The method of FIG. 2C is repeated, in some embodiments, in response to a process by which a user (or an automated process) defines a theoretical variation to land topography, thereby to allow modelling of variations to rainwater flows based on such theoretical variations.

Block 221 represents a process including accessing elevation data (from e.g., a model, DTM/DSM, or from photomosaic pixels). The data may be held in a local or remote storage repository; in the example of FIG. 1 it is stored in database 130. Block 222 represents a point sampling process. In some embodiments, a point-point flow relationship algorithm is performed for every point/pixel in a model. In other embodiments, a sampling method is performed thereby to reduce the number of points that are calculated and reduce processing complexity. Sampling may include selecting points at a desired resolution or point density. In some embodiments, an averaging process is performed thereby to determine an averaged elevation value for each sampled point based on averaging elevations for surrounding points.

Block 223 represents execution a point-point flow relationship algorithm. In some embodiments, the algorithm is configured to determine, for each point (i.e., sampled point where sampling occurs), a metric representative of an amount of rainwater that will reach that point. This may include a process whereby for each point (e.g., Point $X_a$, $Y_a$, $Z_a$) an analysis process is performed thereby to identify a relationship between that point, and a radius of surrounding points, thereby to determine a direction of flow. This, in one embodiment, includes identifying an adjacent point with a lowest elevation value (e.g., Point $X_b$, $Y_b$, $Z_b$). A relationship is then defined between those points, thereby to allow an algorithm to determine that Point $X_b$, $Y_b$, $Z_b$ is related to Point $X_a$, $Y_a$, $Z_a$. Block 223 in one embodiment includes performing such a process for each point, such that each point becomes associated with one or more adjacent upstream points. In some embodiments, the process is iterative and combinatory such that each point becomes associated with all upstream points (adjacent points, points adjacent to those, and so on).

Figure 5B:
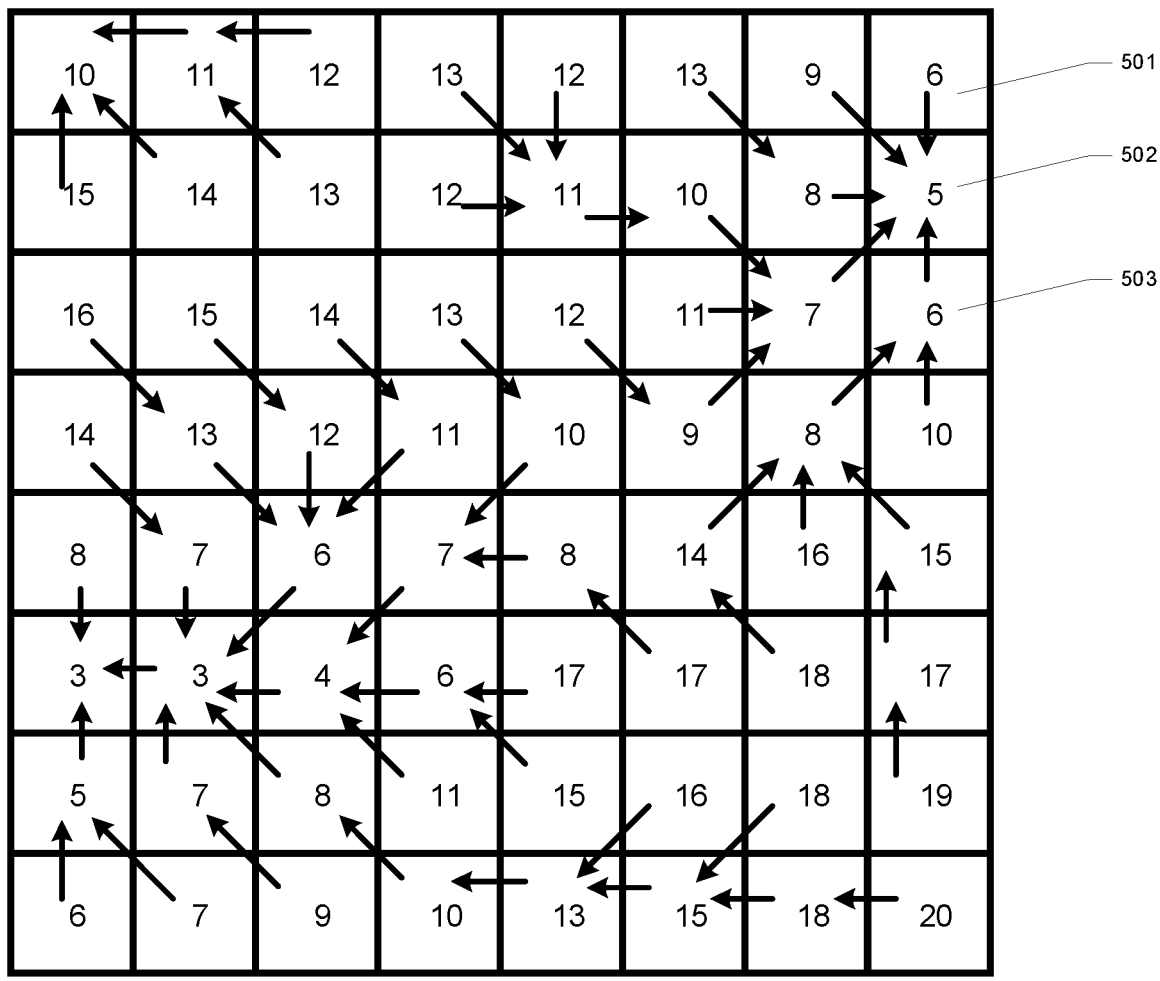

FIG. 5A is provided thereby to graphically illustrate a concept underlying point-to-point relationship determination. FIG. 5 illustrates a matrix of elevation values. Each elevation value represents a point in a point cloud or other 3D model, in some embodiments being a point cloud in which points are spaced equidistantly. FIG. 5B shows arrows from each block in the matrix, pointing to an adjacent block with the lowest elevation value. So, for example, the algorithm processes block 501, representing a point with an elevation value of "6," and determines that adjacent block 502, representing a point with an elevation value of "5," is represents the lowest adjacent point. Therefore, a data store is updated such that the point represented by block 502 is associated with the point represented by block 501. It will be appreciated that, in this example, the point represented by block 502 is ultimately associated with five adjacent points.

Block 224 represents a process where each point is associated with a metric representative of the total number of upstream points, determined based on relationships defined at block 223. This may be a metric defined based on a number of points, or a land area value associated with those points (for example, each point, which may be a sampled point, is associated with an approximated land area based on model resolution as compared with a real-world area represented).

Again referring to the example of FIG. 5B, it can be seen that:

- The point represented by block 501 has zero upstream points, so its total rainfall accumulation is based on the area represented by the point itself.
- The point represented by block 502 has 22 upstream points, so its total rainfall accumulation is based on the area represented by 23 points.

The point represented by block 503 has 8 upstream points, so its total rainfall accumulation is based on the area represented by 8 points.

Based on the algorithmic processes performed at blocks 223 and 224, digital twin graphical modelling is performed at block 225. This may include the generation of overlays and/or numerical information as discussed further below. In a preferred embodiment, each pixel in a model or image file is able to be associated with a plurality of values. For the purposes of a photomosaic, each pixel is associated with a RGB value (or other color scheme value), thereby to cause presentation of photorealistic image data. For the purposes of water flow/accumulation modelling, each pixel (or clumping of pixels, in some sampling-based approaches) is associated with one or more values determined via process including algorithms including or similar to those represented at blocks 223 and 224, and one or more overlay generation processes are configured to convert those values into RGB colors. For example, the following approaches may be used:

- Each pixel has a metric representative of an area of upstream water collection (for example, based on number of upstream points, or area of land associated with all upstream points), and a schema associates bandings of values for that metric with RGB values. For example: a first band for "high accumulation" may be a dark blue, a second band for "medium accumulation" may be a lighter blue, a third band for "low accumulation" may be white, and a fourth band for "negligible accumulation" may be associated with no RGB color (resulting in generation of a transparent region for a mapping overlay/model).
- Each pixel has a metric representative of an area of upstream water collection, and a metric representative of slope gradient. The metric representative of slope gradient for a given pixel/point is preferably determined by a process that takes an average gradient for a region of threshold size around the point (for example, about 1 m by 1 m). This metric is optionally used by an algorithm that associates an RGB color based on a combination of slope gradient and the metric representative of an area of upstream water collection. Example bands might include, for areas: (i) a band for high accumulation and low gradient, in dark blue, to show areas where rainwater water has heavy accumulative collection; (ii) a band for high accumulation and above threshold gradient, in dark red, to show areas where rainwater water has heavy erosion risks; and (iii) other bands defined by a similar approach thereby to enable graduated visual differentiation between areas where water accumulates/flows gradually and areas where water has a more rapid flow (and potentially presents erosion risks).
- Each pixel has a metric representative of an area of upstream water collection, a metric representative of slope gradient, and a metric associated with a soil type (which may be defined manually or by automated processes that, for example, use image processing techniques to categorize soul types based on AI image classification or pixel-color analysis). This may be used to define one or more additional bands that can graphically represent areas susceptible to soil migration due to rainwater flow.
- Each pixel, in addition to one or more of the examples above, has a metric representative of ground surface covering (for example, a form of covering vegetation, an exposed soil type, or the like) that may be determined/predicted vis various image analysis and categorization techniques. This is optionally used by an algorithm to improve assessment of erosion risks (for example, an erosion risk banding is defined by a combination of ground surface covering, water accumulation, and gradient).

Figure 2D:
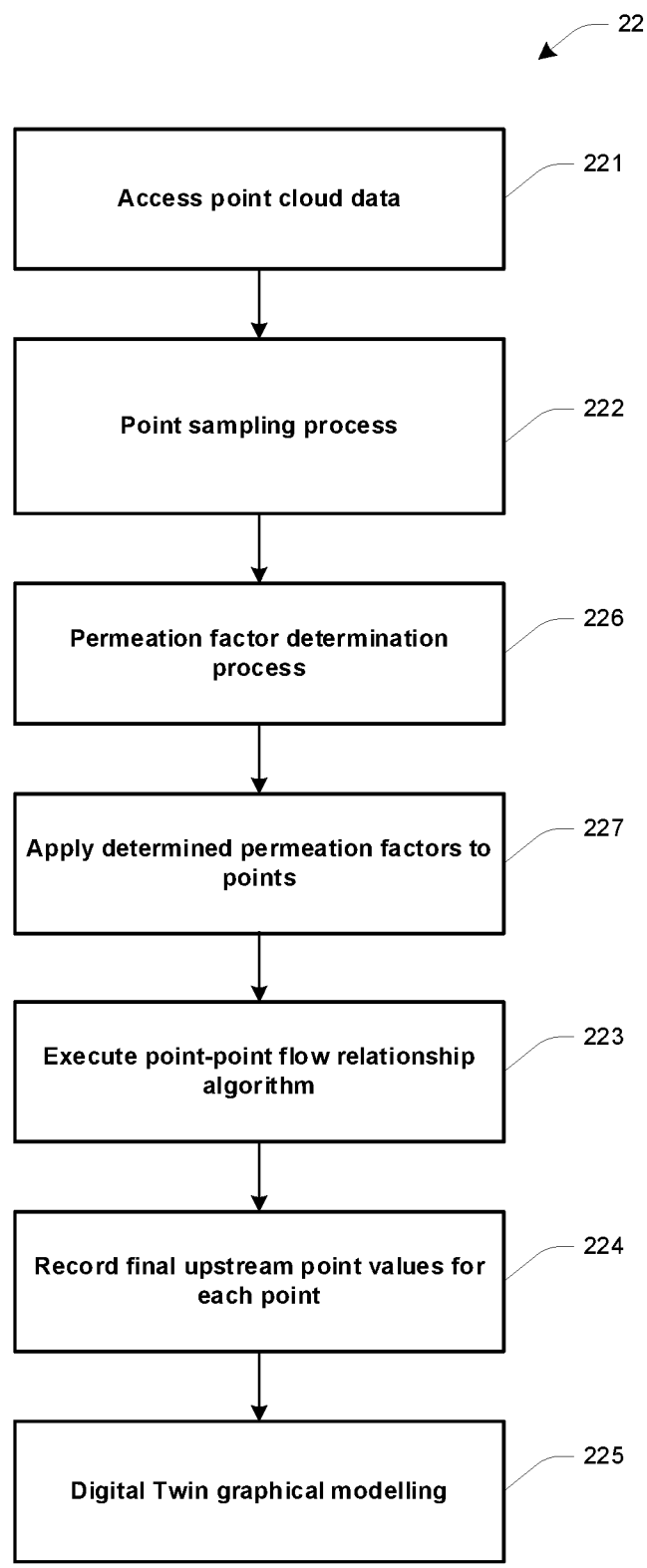

In the example of FIG. 2D, an additional process is incorporated into water accumulation thereby to account for permeation factors. This is optionally defined as a scaling value or percentage, which is representative of a proportion of water in a given area (for example, a pixel area, or sampled clump of pixels) that will flow as opposed to being absorbed. By way of example, an area of rock may have a permeation factor of about 100%, whereas an area of sandy soil may have a permeation factor of 70%. In some embodiments, the permeation factor is determined based on a combination of ground type (for example, based on an image-based prediction of soil type and/or ground coverage, $3^{rd}$ party data/algorithms) and slope gradient. In some embodiments, an additional step is performed thereby to adjust permeation factors based on soil saturation, which may be modelled based on an algorithm that adjusts a permeation factor in response to a measure of accumulation, and/or based on data from physical soil sensors. This is used to improve approximations of an amount of rainwater that accumulates at a given point, based upon an initial accumulation condition (for example, defined in millimeters of rainfall, or as a simple value, e.g., "1," which is representative of a standardized volume of collection). In one embodiment, this is achieved by way of using point-point flow relationships, and adding a value for each upstream point that is scaled by the permeation factor. As such, as an algorithm associated with block 224 records final upstream point values, these are able to be scaled thereby to provide an indication of actual appreciate water flow accounting for permeation. Each point has a total accumulation value defined by a combination of: (i) a local accumulation value (for example, a value of 1 for each point); and (ii) a flow accumulation value, defined by summing of total accumulation values for all adjacently upstream points. This may be calculated via an iterative algorithm that increments the flow accumulation values for points as the flow accumulation values for their upstream points are modified, or an algorithm that orders processing based on point altitudes thereby to calculate flow accumulation values in decreasing order of point altitude.

An example process is represented by blocks 226 and 227 of FIG. 2D. Block 226 represents a permeation factor determination process, which may include image-based categorization thereby to predict presence of a set of soil/ground types, ground coverage types, and so on (optionally also factoring in slope gradient) that are each associated with a predefined permeation factor. Then, at block 227, each underlying pixel/point is associated with the relevant permeation based on the categorization.

In another embodiment, a default approximate permeation factor is applied to all pixels/points.

Figure 5C:
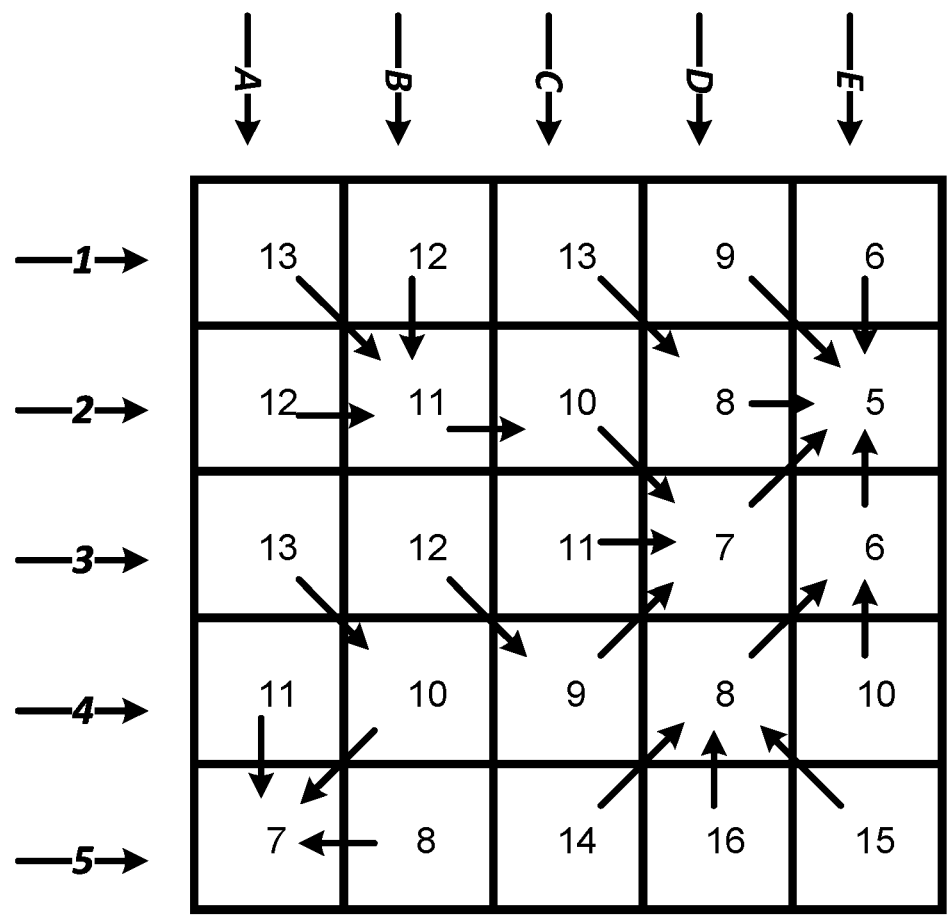

Using the example of FIG. 5C, (which shows a smaller area for the sake of simplicity) assume all pixels in have a permeation factor of 50%. In this example, an iterative algorithm is applied to determine point-point flow relationships accounting for the 50% permeation, and results are as follows:

A1 has no upstream points, has accumulation value of 1 (local and total).

A2 has no upstream points, has accumulation value of 1 (local and total).

A3 has no upstream points, has accumulation value of 1 (local and total).

A4 has no upstream points, has accumulation value of 1 (local and total).

A5 has upstream points A4 (value 1), B4 (value 1.5) and B5 (value 1). It therefore has a value of 1 (local collection) plus a flow accumulation value of 1.75, for a total accumulation value of 2.75.

B1 has no upstream points, has accumulation value of 1 (local and total).

B2 has upstream points A1 (value 1), B1 (value 1) and A2 (value 1). It has a local accumulation value of 1, and a flow accumulation value of 1.5, for a total value of 2.5.

B3 has no upstream points, has accumulation value of 1 (local and total).

B4 has upstream point A2 (value 1). It has a local accumulation value of 1, and a flow accumulation value of 0.5, for a total value of 1.5.

B5 has no upstream points, has accumulation value of 1 (local and total).

C1 has no upstream points, has accumulation value of 1 (local and total).

C2 has one upstream point, being B2 with a value of 2.5. It has a local value of 1, and an accumulated value of 1.25, for a total of 2.25.

C3 has no upstream points, has accumulation value of 1 (local and total).

C4 has one upstream point, being B3 with a value of 1. It has a local value of 1, and an accumulated value of 0.5, for a total of 1.5.

C5 has no upstream points, has accumulation value of 1 (local and total).

D1 has no upstream points, has accumulation value of 1 (local and total).

D2 has one upstream point, being C1 with a value of 1. It has a local value of 1, and an accumulated value of 0.5, for a total of 1.5.

D3 has upstream points C2 (value 2.25), C3 (value 1) and C4 (value 1.5). It has a local accumulation value of 1, and a flow accumulation value of 2.375, for a total value of 3.375.

D4 has upstream points C5 (value 1), D5 (value 1) and E5 (value 1). It has a local accumulation value of 1, and a flow accumulation value of 1.5, for a total value of 2.5.

D5 has no upstream points, has accumulation value of 1 (local and total).

E1 has no upstream points, has accumulation value of 1 (local and total).

E2 has upstream points D1 (value 1), D2 (value 1.5), D3 (value 3.375), E1 (value 1) and E3 (value 2.75). It has a local accumulation value of 1, and a flow accumulation value of 4.3125, for a total value of 5.3125.

E3 has upstream points D4 (value 2.5) and E4 (value 1). It has a local accumulation value of 1, and a flow accumulation value of 1.75, for a total value of 2.75.

E4 has no upstream points, has accumulation value of 1 (local and total).

E5 has no upstream points, has accumulation value of 1 (local and total).

These total accumulation values provide a proxy for practical accumulation, which can be applied as a scaling factor to precipitation accumulation. For example, assume rainfall is 1 mm$^2$ per point. Each point with a total accumulation value of 1 has potential to collect 1 mm$^2$, each point with a total accumulation value of X has potential to collect X mm$^2$.

It will be appreciated that absent of an accumulation condition (e.g., a dam), the permeation factor describes a quantity of water that permeates into the ground at that point (X mm$^2$ multiplied by the inverse of the permeation factor). In some embodiments, terrain modelling is performed thereby to identify depressions (natural or manmade dams) thereby to enable modelling of terrain filling based on accumulation of a defined volume of precipitation.

It will be appreciated that this is a simple example, which uses a standard permeation factor that is not spatially variable based on gradient, soil and/or ground cover. However, it can be seen how an iterative relationship identification algorithm is used to determine rainwater accumulation at each point/pixel in a model based on relative elevation data. This simple example should not be regarded as representing that the broader technology disclosed herein relating to rainwater collection could be implemented without the use of technology; while a heavily simplified example demonstrates that a component of one example algorithm can be performed manually, computer implementation is core and critical to the overall technology, which has key attributes utilization of 3D model data and rendering of a digital twin style interface.

In some embodiments, additional processing is performed thereby to associate each point with a collection potential metric. This is optionally based on identifying one or more terminal collection points, defined by points/regions that represents local minima (i.e., all adjacent points have higher elevation values), and for each point defining a metric representative of a relationship in terms of distance and elevation to its flow-associated local minima. In some embodiments, processing is performed thereby to associate each point with a flow rate metric based on a localized average slope gradient. These and other factors may be used thereby to assign color coding to areas of a model overlay thereby to represent rainfall accumulation and collection metrics.

It will be appreciated that the above examples enable configuration of the AgTwin interface to provide graphical overlays representative of rainwater flow and collection properties (optionally including erosion risk properties) for a region of agricultural land. The AgTwin interface may also be configured to trigger additional processing techniques thereby to enable further modelling at block 225, based on the processing techniques described in preceding blocks of method 210 and/or 220. Examples are provided below.

The AgTwin interface is configured, in some embodiments, to receive, via the user interface, an instruction to display rainwater capture modelling data for one or more defined target regions within the agricultural land region. This may include:

A user selecting a single isolated target region, or multiple isolated target regions. These may include regions relevant to rainwater collection, for example: regions that are predefined to represent rainwater collection infrastructure (for example, a dam), regions selected by a user using user interface selection tools to represent an existing or proposed location for rainwater collection infrastructure (for example, a dam). Other types of region may also be collected, for example, a region that is being considered for a given agricultural use. This may be used for assessment of existing and/or proposed dams, by way of example, as discussed further below.

An automated process identifying one or more target regions, for example, based on topology attributes. This may include an automated process that identifies optimal dam locations, based on an optimal dam location determination process as discussed further below. This may also include identifying target regions that are within a defined acceptable gradient range for specific agricultural activities (for example, land that is suitable for categories of crops, grazing, and so on).

A target region that is defined by all or a majority of the agricultural land region.

For the purposes of streamlined description, it will be assumed that the instruction of is representative of single target region (although in other examples multiple discrete target regions are included). The instruction may be provided by various means, including (by way of example):

Selecting a function from a user interface menu;
Selecting the target region, and then selecting a function from a user interface menu; and/or
Selecting a function from a user interface menu, and then selecting the target region.

In response, an algorithm is executed thereby to determine rainwater collection properties for the target region (using point-point flow metrics as discussed above), and the user interface to render a graphical output representative of modelled rainwater collection properties for the target region.

The algorithm may include:

An algorithm that calculates both: (i) total area surface of the target region; and (ii) total area covered by all points with upstream flow relationships with points within the target region, thereby to calculate a total surface area of rainwater catchment for the target region.

An algorithm that sums accumulation values for all points within the target region (optionally based on the example above which accounts for permeation factors).

An algorithm that identifies a set of points that define a periphery for the target region, determines collection properties for those points from outside the periphery, including permeation factors, thereby to determine a measure of flow into the region, and combines that with a collection metric based on the surface area of the target region. For example, referring to FIG. 5C, if the target region is D1, E1, D2, E2, D3, and E3, the collection value may be determined as a sum of the values for D1, E1, D2, D3, and E3, plus the local accumulation value for E2.

The graphical output may include:

Alphanumeric data overlays, for example, representing rainwater collection as a proportion of possible collection, relative ratings (e.g., high/medium/low), collection metrics defined based on modelled region.

Graphical overlays (for example, colors or patterns), for example, overlays representative of relative ratings (e.g., high/medium/low collection), and/or overlays that are representative of suitability/unsuitability of land for specific agricultural purposes based on rainwater collection properties (for example, specific crops, grazing, etc.).

Example use cases are discussed below. It will be appreciated that these are examples only.

Use Case 1: Analysis of Existing Dam Infrastructure

In one example use case, system 100 is configured to provide for analysis of existing dam infrastructure.

In some embodiments, a target region analysis module 107 is configured to identify one or more existing dams in an agricultural land region. This may be achieved via image analysis, for example, via an AI classifier that is trained to identify dams in image data. Alternately/additionally, an algorithm (also optionally including an AI classifier) can be used to identify dam locations based on topology as defined by the elevation data (for example, an AI classifier is trained to identify dams based on elevation data). Preferably a combination approach is used, as image-based classification is useful for same currently containing water (but not empty dams) and point cloud based classification is useful for empty and partially empty dams (but not full or substantially full dams).

In alternate embodiments, a user manually marks existing dams, for example, via UI tools that allow for selection of regions represented by an AgTwin interface (for example, a "click and drag" selection tool), which may be enhanced to identify a region of local minima altitude in a selected area based on elevation data relative z-axis values.

Once target regions representing existing dams are identified, a water collection flow algorithm is used to model rainwater collection for covered elevation data points (as a set sampling rate) and determine a modelled rainwater collection metric for each of the one or more defined target regions. For example, this may include a process as described above whereby all points having direct/indirect downstream flow relationships to points in the target region.

Based on execution of the water collection flow algorithm, metrics of dam efficiency are determined and presented via the user interface. This may include: (i) a percentage of available total rainwater that is captured by a particular existing dam; (ii) a percentage of available total rainwater that is captured by a particular collection of existing dams; and/or (iii) predicted collection metrics (for example, per mm rainfall) for one or each of the existing dams.

Use Case 2: Analysis of Proposed Dam Infrastructure

In one example use case, system 100 is configured to provide for analysis of proposed dam infrastructure.

In some embodiments, a the AgTwin user interface a user to manually mark a location for one or more proposed dams, for example, via UI tools that allow for selection of regions represented by an AgTwin interface (for example, a "click and drag" selection tool). In some cases the user interface may allow the user to input additional specifications for a proposed dam, for example, depth. In some embodiments, the AgTwin interface may suggest optimal dam locations based on an algorithm that identifies points in the elevation data with a high (i.e., above threshold, or top percentile) number of direct/indirect downstream flow associated points.

Once target regions representing proposed dams are identified, a water collection flow algorithm is used to model rainwater collection for covered elevation data points (as a set sampling rate) and determine a modelled rainwater collection metric for each of the one or more defined target regions. For example, this may include a process as described above whereby all points having direct/indirect downstream flow relationships to points in the target region.

Based on execution of the water collection flow algorithm, metrics of dam efficiency are determined and presented via the user interface. This may include: (i) a percentage of available total rainwater that is captured by a particular existing dam; (ii) a percentage of available total rainwater that is captured by a particular collection of existing dams; and/or (iii) predicted collection metrics (for example, per mm rainfall) for one or each of the existing dams.

Use Case 3: Analysis with Topology Modification

In some embodiments, system 100 includes a topography modification module 104 that enables, via the AgTwin user interface, a user to modify actual topology of the region (for example, by raising or lowering particular areas). This defines a new set of elevation data, which may be used for theoretical modelling, for example, modelling of existing and/or proposed dams as described above.

Use Case 4: Farming Land Suitability Analysis

In some embodiments, one or more target regions identified as farming land. This may be based on an automated algorithm that categorizes areas based on slope gradient, and one or more other factors, thereby to identify regions potentially suitable for certain forms of agricultural activities. Alternately, a user may identify such target regions manually via the user interface (e.g., click and drag selection).

For each of the identified target regions, the algorithm is configured to determine a metric of rainwater collection throughout that region. For example, this may include an overlay of relative rainwater collection properties based on each elevation data point within the region. This differs from dam analysis: in dam analysis it is relevant to consider total capture over the target region; for this form of analysis it is relevant to determine relative collection properties across the target region. This assists in identifying, for a given region, areas that are more suitable to different forms of agricultural activities.

Use Case 5: Soil Transport

In some embodiments, one or more target regions are identified as having valuable topsoil, and point-point flow characteristics are used to identify soil transport properties. This is optionally achieved via an algorithm that utilizes a modified permeation factor, thereby to provide a measure of soil transport rather than rainwater transport flow. In an example embodiment this includes:
  Defining a standardized transport factor for a given soil type (or a standard soil type). For example, the standardized transport factor might be 1%, based on a standard slope gradient of degrees, meaning that 1% of topsoil will be transported for each X mm of rain on a slope of 20 degrees (for example, X may be 10 mm).
  Defining an algorithm that adjusts that standardized factor based on gradients other than 20 degrees (the factor will increase for localized gradients over 20 degrees, and decrease for gradients under 20 degrees), thereby to define gradient-specific transport factors.
  Execute an algorithm, for example, a rainwater flow algorithm discussed above with the permeation factor replaced by gradient-specific standardized transport factor factors, thereby to identify regions having greater than a threshold collection (and/or loss) of topsoil. It will be appreciated that whereas the rainwater algorithm enables identification of rainwater accumulation values for each point, this approach provides soil accumulation values for each point.

In an example embodiment, a user selects a region having valuable topsoil (e.g., a segregated field), and triggers analysis of that region thereby to identify one or more topsoil catchment locations for that region, and a measure of how much topsoil accumulates in that region per X mm of rain.

In some embodiments, regions at risk of soil transport are identified, and topology modification modelling as discussed above is utilized thereby to model topology variations proposed to reduce topsoil transport and/or collect transported topsoil in a desired region.

Figure 2E:
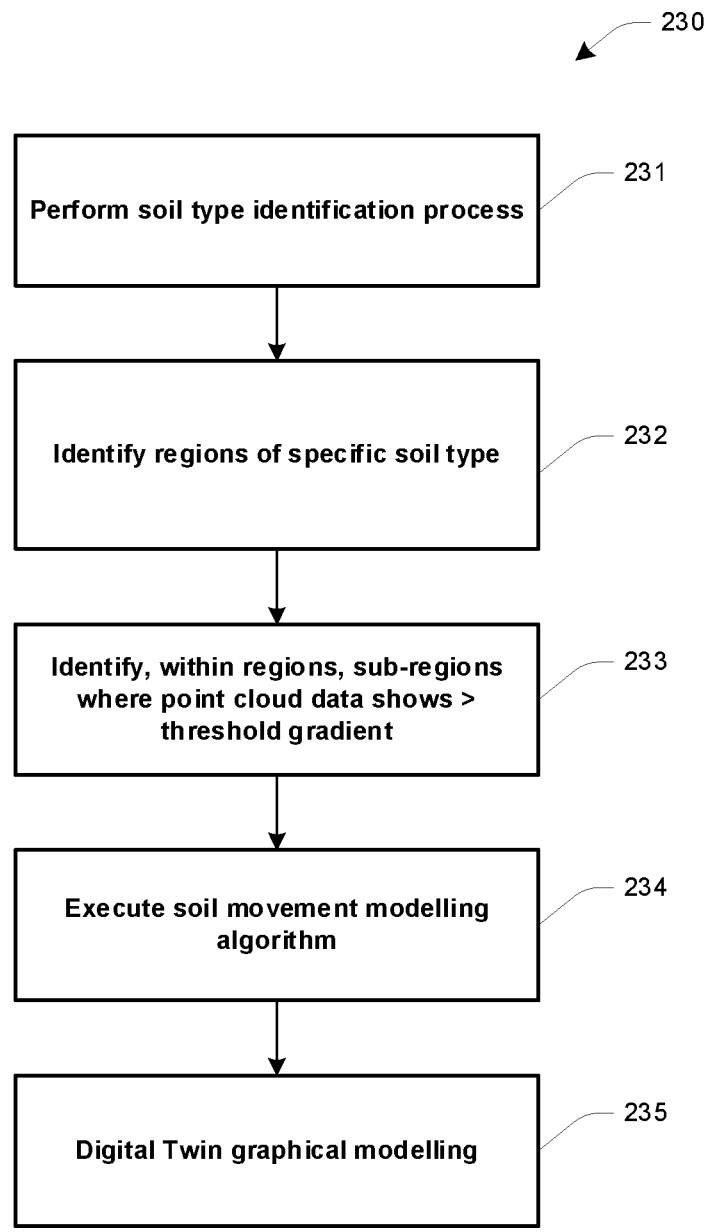

An example is provided in FIG. 2E via method 230. Block 231 represents performance of a soil type identification process across an area, which may make use of the likes of image classification, spectral analysis, or the like to determine soil types (or infer soil types from vegetation). A specific soil type of interest is selected, and regions determined to have this soil type identified at block 232. Within these regions, block 233 represents a process of identifying sub-regions having greater than a threshold gradient. Then, as represented by block 234, for each point in those sub regions, a soil movement modelling using transport factors is executed thereby to identify soil accumulation and loss at points (accumulation is based upon a corresponding approach to rainwater accumulation, but based on soil transport factors rather than permeation factors; loss is based on the point-specific transport factor applied to total collection value at a given point). Graphical overlays or the like are then generated and displayed via the AgTwin interface at block 235.

Use Case 6: Analysis of Chemical Containment

Rainwater flow analysis is applied thereby, in some embodiments, to enable analysis of chemical containment.

As context, there is often value in knowing whether a chemical (for example, pesticide, or other substance) present at a location on a defined region of agricultural land has potential to leave that agricultural land as a result of rainwater movement. For example, the chemical could leach into a waterway that leaves the region, or leaches across to a neighboring region. In some embodiments, a point-point flow relationship algorithm as discussed above is used to support a computer process that is configured to determine either or both of the following:
  For a selected target region, all points outside that target region that are downstream of points inside the region. For example, a user selects a target region, and all points with an upstream flow relationship to points within that region are graphically identified via colorized overlay. This provides a graphical indication of where a chemical (or other substance) applied to/present in the target region is capable of being transported based on surface rainwater movement.
  A target region is defined along a periphery a target region (which may be the entire region of agricultural land), and all points with an upstream flow relationship to the points in that target region are identified. This is optionally used to generate either or both of the following overlays: (i) an overlay that highlights all points with the upstream flow relationship, thereby visually identifying all areas at risk of off-region chemical transport; and (ii) an overlay that highlights all points lacking the upstream flow relationship, thereby identifying all areas isolated from risk of off-region chemical transport.

This is particularly useful in, for example, planning crop locations based on a desire to use pesticides, planning locations for potentially polluting activities, and the like. It can also be used for auditing processes thereby to assess whether an identified pollution event may have originated on the particular region of agricultural land.

Use Case 7: Analysis of Irrigation Infrastructure

In a further embodiment, point-point flow relationships are used to assess operation of existing and/or proposed irrigation equipment.

In previous examples, rainwater collection algorithms operate on the basis of a condition that initial accumulation occurs evenly across an entire region, and then: (i) moves in accordance with point-point flow relationships; and (ii) is lost based on the defined permeation factor.

In some embodiments, an algorithm is modified to define an initial accumulation condition at defined points only (referred to herein as "irrigation dispensary points"), with the defined points being defined based on actual or proposed positioning of irrigation infrastructure. For example, a plurality of points are associated with an initial accumulation value of "X," which may represent a measure based on volume and/or time. Then, point-point relationships and permeation factors are used to define relative accumulations at other points (either across an entire region, or a reduced area defined proximal relative to the irrigation dispensary points).

Figure 3:
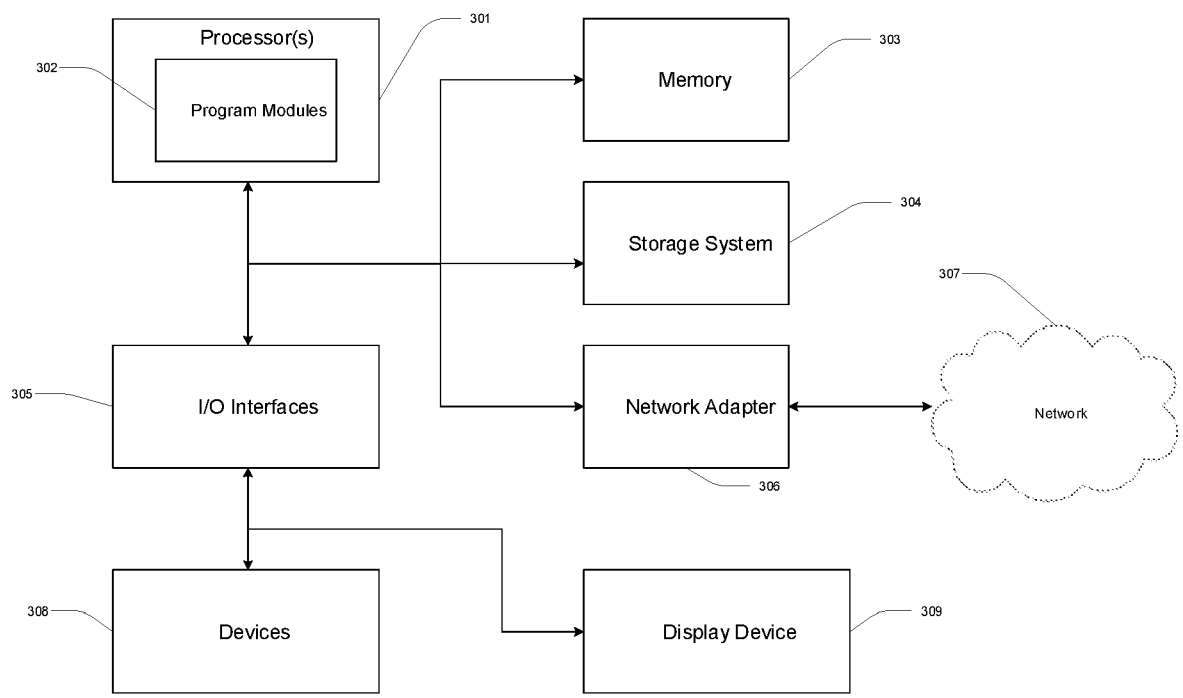
FIG. 3 illustrates an example computer or processing system.

FIG. 3 illustrates an example computer or processing system that may implement any portion systems, methods, and computer program products described herein in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 301, a system memory 303, and a bus 305 that couples various system components including system memory 303 to processor 301. The processor 301 may include a software module 302 that performs the methods described herein. The module 302 may be programmed into the integrated circuits of the processor 301, or loaded from memory 303, storage device 304, or network 307 or combinations thereof.

Bus 305 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 303 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 305 by one or more data media interfaces.

Computer system may also communicate with one or more external devices 308 such as a keyboard, a pointing device, a display 309, etc.; one or more devices that enable a user to interact with computer system; and/or any devices (e.g., network card, modem, etc.) that enable computer system to communicate with one or more other computing devices. Such communication can occur via Input/Output (I/O) interfaces 305.

Still yet, computer system can communicate with one or more networks 307 such as a local area network (LAN), a general wide area network (WAN), and/or a public network (e.g., the Internet) via network adapter 306. As depicted, network adapter 306 communicates with the other components of computer system via bus 305. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described with reference to flowchart illustrations and/or block diagrams of methods, apparatus (systems) and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions that execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and that-when loaded in a computer system-is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the disclosure. The embodiment was chosen and described in order to best explain the principles of the present disclosure and the practical application, and to enable others of ordinary skill in the art to understand the present disclosure for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present disclosure may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present disclosure may include and may be included within fixed and portable devices such as desktop, laptop, and/or server. A module may be a component of a device, software, program, or system that implements some "functionality," which can be embodied as software, hardware, firmware, electronic circuitry, or etc.

Although specific embodiments of the present disclosure have been described, it will be understood by those of skill in the art that there are other embodiments that are equivalent to the described embodiments. Accordingly, it is to be understood that the invention is not to be limited by the specific illustrated embodiments, but only by the scope of the accompanying claims.

It should be appreciated that in the above description of exemplary embodiments of the present disclosure, various features of the present disclosure are sometimes grouped together in a single embodiment, FIG., or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this present disclosure.

Furthermore, while some embodiments described herein include some but not other features included in other embodiments, combinations of features of different embodiments are meant to be within the scope of the present disclosure, and form different embodiments, as would be understood by those skilled in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the present disclosure.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B that may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the present disclosure, those skilled in the art will recognize that other and further modifications may be made thereto without departing from the spirit of the invention, and it is intended to claim all such changes and modifications as falling within the scope of the invention. For example, any formulas given above are merely representative of procedures that may be used. Functionality may be added or deleted from the block diagrams and operations may be interchanged among functional blocks. Steps may be added or deleted to methods described within the scope of the present disclosure.

The invention claimed is:

1. A computer implemented method configured to provide a graphical user interface configured to enable delivery of information relating to an agricultural land region, the method including:
  maintaining access to a data source that includes a terrain mapping data representative of an agricultural land region, wherein the terrain mapping data includes, for a matrix of points defined for an X-axis and Y-Axis across a terrain area, a respective Z-axis value for each of those points that represents a relative point altitude;
  causing rendering, at a client terminal, of a user interface that allows for visualization of digital information for the agricultural land region, wherein the user interface includes a digital twin component that includes a three-dimensional object generated based on the terrain mapping data and one or more surface overlays applied to the terrain mapping data;
  in a first mode of operation, configuring the digital twin component to render the three-dimensional object with a photo-resolution image overlay;
  in a second mode of operation, which is accessed based on a predefined command, configuring the digital twin component to render the three-dimensional object with a secondary overlay generated based on any one or more of: (i) lower-resolution satellite imagery; (ii) data received from one or more physical sensors located on the agricultural land region; (iii) data representative of water flow and/or collection properties; and (iv) models derived from high resolution LiDAR scanning;

causing rendering, at a client terminal, of a user interface that allows for visualization of digital information for the agricultural land region, wherein the user interface includes a digital twin component that includes a three-dimensional object generated based on the terrain mapping data and one or more surface overlays applied to the terrain mapping data;

via the user interface, receiving an instruction to display water flow modelling data for one or more defined target regions within the agricultural land region;

for each of a sampling of points within each of the one or more defined target regions, based on execution of a downstream flow analysis algorithm, determine a measure of modelled upstream flow;

based on the measures of modelled upstream flow for the sampling of points within each of the one or more defined target regions, determining a modelled upstream flow metric for each of the one or more defined target regions; and causing the user interface to render a graphical output representative of modelled upstream flow properties for each of the one or more defined target regions.

2. The computer implemented method of claim 1, wherein the first mode of operation is configured to provide a static data overlay, and the second mode of operation is configured to provide a live data or dynamic overlay.

3. The computer implemented method of claim 2, wherein the second mode of operation is configured to provide a live data overlay, and wherein providing the live data overlay includes: (i) obtaining live data from a networked data source; (ii) defining a two-dimensional overlay data file based on the live data; and (iii) applying the defined two-dimensional overlay data file as a surface to the terrain mapping data.

4. The computer implemented method of claim 1, wherein the three-dimensional object with a photo-resolution image overlay is derived from a combination of LiDAR scanning and aerial photography.

5. The computer implemented method of claim 1, wherein the secondary overlay is generated from one or more satellite images at a lower resolution compared with the photo-resolution image.

6. The computer implemented method of claim 5, wherein the user interface allows for a user to cause cycling through a plurality of overlays each defined based on a respective point-in-time set of one or more satellite images.

7. The computer implemented method of claim 1, wherein the sensor data includes data from any one or more of: soil sensors; temperature sensors; fence sensors; machinery-mounted sensors; and livestock-mounted sensors.

8. The computer implemented method of claim 1, further including providing an interface that is configured to receive input data from a third-party networked system such that, in the second mode of operation the digital twin component is configurable to render the three-dimensional object with a secondary overlay generated based that input data.

9. The computer implemented method of claim 1, wherein the models derived from high resolution LiDAR scanning include vegetation information.

10. The computer implemented method of claim 1, further including executing a process thereby to identify one or more optimal rainwater collection zones.

11. The computer implemented method of claim 1, wherein the one or more defined target regions include one or more target regions identified as farming land, and wherein the graphical output representative of modelled upstream flow properties for each of the one or more defined target regions provides a relative indication of water collection properties for that farming land.

12. The computer implemented method of claim 1, further including:
performing analysis of aerial photography data associated with the terrain mapping data, thereby to execute a field identification and segregation algorithm; and
enabling, via the digital twin component, individualized selection of segregated fields thereby to access digital twin data for a selected one or more of the segregated fields.

* * * * *